United States Patent
Kellogg et al.

(10) Patent No.: US 10,118,263 B2
(45) Date of Patent: Nov. 6, 2018

(54) MONOLITHIC MANIFOLD MASK AND SUBSTRATE CONCEPTS

(71) Applicant: Lam Research Corporation, Fremont, CA (US)

(72) Inventors: Michael C. Kellogg, San Francisco, CA (US); Andrew C. Lee, Daly City, CA (US); Christopher J. Pena, Hayward, CA (US)

(73) Assignee: Lam Researech Corporation, Fremont, CA (US)

( * ) Notice: Subject to any disclaimer, the term of this patent is extended or adjusted under 35 U.S.C. 154(b) by 309 days.

(21) Appl. No.: 14/843,775

(22) Filed: Sep. 2, 2015

(65) Prior Publication Data

US 2017/0057028 A1   Mar. 2, 2017

(51) Int. Cl.
| | |
|---|---|
| *B23P 19/04* | (2006.01) |
| *B23P 19/10* | (2006.01) |
| *B23P 19/12* | (2006.01) |
| *H01L 21/00* | (2006.01) |
| *H01L 21/02* | (2006.01) |

(52) U.S. Cl.
CPC ............... *B23P 19/10* (2013.01); *B23P 19/12* (2013.01); *H01L 21/00* (2013.01); *H01L 21/02* (2013.01); *B23P 19/04* (2013.01); *Y10T 29/49895* (2015.01); *Y10T 29/49899* (2015.01); *Y10T 29/49902* (2015.01)

(58) Field of Classification Search
CPC   B23P 19/10; B23P 19/12; B23P 19/04; Y10T 29/49895; Y10T 29/49899; Y10T 29/49902; H01L 21/00; H01L 21/02

USPC .................................................. 29/464, 466
See application file for complete search history.

(56) References Cited

U.S. PATENT DOCUMENTS

| | | | | |
|---|---|---|---|---|
| 4,057,659 A | * | 11/1977 | Pammer | H01L 21/00 |
| | | | | 257/758 |
| 4,420,142 A | | 12/1983 | Dworak et al. | |
| 4,545,328 A | | 10/1985 | Fujiyama et al. | |
| 5,559,444 A | * | 9/1996 | Farnworth | G01R 1/0466 |
| | | | | 257/E21.509 |
| 5,803,124 A | * | 9/1998 | Newton | B60T 17/04 |
| | | | | 137/884 |
| 5,836,355 A | | 11/1998 | Markulec et al. | |
| 6,068,016 A | | 5/2000 | Manofsky, Jr. et al. | |
| 6,073,646 A | | 6/2000 | Kimura | |
| 6,168,948 B1 | | 1/2001 | Anderson et al. | |
| 6,186,177 B1 | | 2/2001 | Maher | |

(Continued)

FOREIGN PATENT DOCUMENTS

| | | |
|---|---|---|
| JP | 2003-334479 A | 11/2003 |
| JP | 2004-214591 A | 7/2004 |

(Continued)

OTHER PUBLICATIONS

U.S. Office Action, dated Jun. 22, 2017, issued in U.S. Appl. No. 14/517,192.

(Continued)

*Primary Examiner* — Bayan Salone
(74) *Attorney, Agent, or Firm* — Weaver Austin Villeneuve & Sampson LLP

(57) ABSTRACT

Component-locating templates or masks for use with positioning fluid-flow components on monolithic ceramic substrates are provided, as well as techniques for the manufacture of such templates.

13 Claims, 18 Drawing Sheets

(56) References Cited

U.S. PATENT DOCUMENTS

| | | | |
|---|---|---|---|
| 6,234,191 B1* | 5/2001 | Clarke | B60T 17/04 |
| | | | 137/269 |
| 6,260,581 B1 | 7/2001 | Hollingshead | |
| 6,283,143 B1 | 9/2001 | Adachi, Jr. et al. | |
| 6,302,141 B1 | 10/2001 | Markulec et al. | |
| 6,352,594 B2 | 3/2002 | Cook et al. | |
| 6,440,504 B1 | 8/2002 | Akiyama | |
| 6,546,960 B1 | 4/2003 | Rohrberg et al. | |
| 6,581,640 B1* | 6/2003 | Barron | F15C 5/00 |
| | | | 137/833 |
| 6,640,835 B1* | 11/2003 | Rohrberg | F16K 27/003 |
| | | | 137/884 |
| 6,648,020 B2 | 11/2003 | Fujimoto et al. | |
| 6,718,817 B1 | 4/2004 | Ko et al. | |
| 6,753,200 B2 | 6/2004 | Craighead et al. | |
| 6,777,820 B2* | 8/2004 | Chiba | H01L 23/544 |
| | | | 257/618 |
| 6,880,745 B2 | 4/2005 | Stueber et al. | |
| 6,907,904 B2 | 6/2005 | Harris et al. | |
| 7,055,550 B2 | 6/2006 | Harris et al. | |
| 7,126,094 B2 | 10/2006 | Bower et al. | |
| 7,150,475 B2 | 12/2006 | Eriksson et al. | |
| 7,178,556 B2 | 2/2007 | Reid, II et al. | |
| 7,195,037 B2 | 3/2007 | Eidsmore | |
| 7,225,835 B2 | 6/2007 | Vu | |
| 7,234,222 B1 | 6/2007 | Hao et al. | |
| 7,261,812 B1 | 8/2007 | Karp et al. | |
| 7,299,825 B2 | 11/2007 | Milburn | |
| 7,307,247 B2 | 12/2007 | Bower et al. | |
| 7,320,339 B2 | 1/2008 | Milburn | |
| 7,334,605 B2 | 2/2008 | Vu | |
| 7,404,417 B2 | 7/2008 | Eidsmore | |
| 7,410,519 B1 | 8/2008 | Ewald | |
| 7,789,107 B2 | 9/2010 | Eriksson et al. | |
| 7,798,388 B2 | 9/2010 | Crockett et al. | |
| 7,892,357 B2 | 2/2011 | Srivastava | |
| 7,976,795 B2 | 7/2011 | Zhou et al. | |
| 8,122,910 B2 | 2/2012 | Taskar | |
| 8,196,480 B1 | 6/2012 | Mayeaux | |
| 8,196,609 B2 | 6/2012 | Oya et al. | |
| 8,322,380 B2* | 12/2012 | Taskar | F16L 41/03 |
| | | | 137/884 |
| 8,340,827 B2 | 12/2012 | Yun et al. | |
| 8,521,461 B2 | 8/2013 | Shareef et al. | |
| 8,746,284 B2 | 6/2014 | DeDontney | |
| 8,794,267 B2 | 8/2014 | Shareef et al. | |
| 8,846,183 B2 | 9/2014 | Unger et al. | |
| 8,851,113 B2 | 10/2014 | Taskar et al. | |
| 8,852,685 B2 | 10/2014 | Kenworthy et al. | |
| 9,090,972 B2* | 7/2015 | Shareef | G05D 7/06 |
| 2002/0017329 A1 | 2/2002 | Fukushima | |
| 2002/0072164 A1 | 6/2002 | Umotyo et al. | |
| 2003/0051620 A1 | 3/2003 | Schafer | |
| 2003/0124842 A1 | 7/2003 | Hytros et al. | |
| 2004/0092118 A1 | 5/2004 | Johnson et al. | |
| 2004/0189311 A1 | 9/2004 | Glezer et al. | |
| 2005/0005981 A1 | 1/2005 | Eidsmore et al. | |
| 2005/0284529 A1 | 12/2005 | Iwabuchi | |
| 2008/0047622 A1* | 2/2008 | Fuller | F16K 99/0001 |
| | | | 137/625.18 |
| 2008/0066859 A1 | 3/2008 | Kobayashi et al. | |
| 2012/0237696 A1 | 9/2012 | Huseinovic et al. | |
| 2013/0025718 A1 | 1/2013 | Nagase et al. | |
| 2013/0255782 A1 | 10/2013 | Shareef et al. | |
| 2013/0255883 A1 | 10/2013 | Shareef et al. | |
| 2014/0020779 A1 | 1/2014 | Vu | |
| 2014/0076236 A1 | 3/2014 | Sankarakrishnan et al. | |
| 2014/0090599 A1 | 4/2014 | Saitou | |
| 2014/0137961 A1 | 5/2014 | Kao et al. | |
| 2014/0182689 A1 | 7/2014 | Shareef et al. | |
| 2015/0362080 A1 | 12/2015 | Vu | |
| 2016/0108523 A1* | 4/2016 | Lee | B24B 37/042 |
| | | | 156/89.11 |
| 2016/0111257 A1* | 4/2016 | Kellogg | H01J 37/3244 |
| | | | 438/710 |
| 2017/0203511 A1 | 7/2017 | Burkhart et al. | |
| 2017/0204989 A1 | 7/2017 | Burkhart et al. | |

FOREIGN PATENT DOCUMENTS

| | | |
|---|---|---|
| KR | 10-2009-0125681 | 12/2009 |
| WO | 2014/199158 A1 | 12/2014 |
| WO | 2016/061493 A1 | 4/2016 |

OTHER PUBLICATIONS

U.S. Office Action, dated Aug. 4, 2017, issued in U.S. Appl. No. 14/884,575.

U.S. Office Action, dated Dec. 30, 2016, issued in U.S. Appl. No. 14/997,419.

U.S. Final Office Action, dated Jul. 10, 2017, issued in U.S. Appl. No. 14/997,419.

PCT International Search Report and Written Opinion dated Dec. 28, 2015 issued in PCT/US2015/0555997.

PCT International Preliminary Report on Patentability and Written Opinion dated Apr. 27, 2017 issued in PCT/US2015/0555997.

"MicroSeal™ Product Selection Guide," *Microflex Technologies*, (2004), 6 pages.

"Metal Seal Design Guide, High Performance Engineered Seals and Sealing Systems," *Parker Hannifin Corporation, Composite Sealing Systems Division*, (2013), 106 pages.

* cited by examiner

................ Dotted lines show outlines of features from first template 114
that are different from features on the second template 116

MONOLITHIC MANIFOLD MASK AND SUBSTRATE CONCEPTS

BACKGROUND

Semiconductor manufacturing processes utilize a variety of different types of process gases that must be delivered with precise timing and in precise quantities and/or at precise delivery rates. In some cases, a semiconductor processing tool may utilize ten or more process gases, e.g., 14 different process gases, each of which must have its own separate control hardware. This collection of control hardware, which may include valves, mass flow controllers (MFCs), tubing, fittings, etc., is typically housed in a "gas box," which is a cabinet or other structure that is typically mounted to the semiconductor processing tool (or in another location nearby).

BRIEF DESCRIPTION OF THE DRAWINGS

FIGS. 1 through 4, 6, 7, and 12 through 20 are drawn to-scale within each Figure, although not necessarily from Figure to Figure.

SUMMARY

Figure 1:
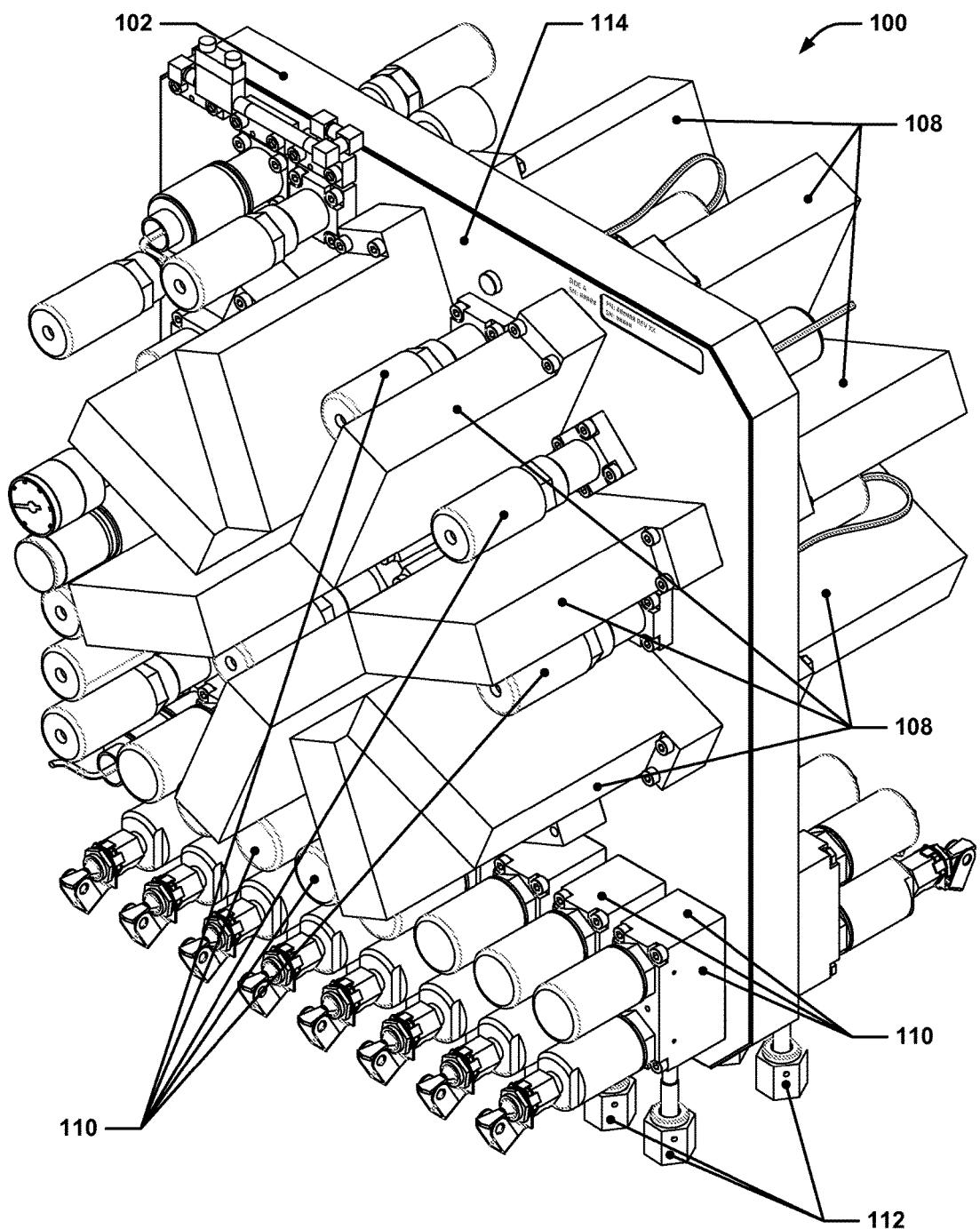
FIG. 1 depicts an isometric view of an example ceramic monolithic manifold "CMM" design that accommodates at least sixteen separate processing gases (or liquids).

In some implementations, an apparatus for locating parts to be assembled with a ceramic substrate is provided. The ceramic substrate may have a plurality of first drop-holes formed in a first side of the ceramic substrate prior to sintering of the ceramic substrate, One or more reference features may also be formed in the ceramic after the ceramic substrate has been sintered. The reference features may define a substrate reference coordinate system, and each first drop-hole may be associated with a port of one of a plurality of first fluid flow components. In such implementations, the apparatus may include a template that includes one or more template-locating features configured to interface with the one or more reference features of the ceramic substrate so as to locate the template relative to the ceramic substrate when the template is laid against the first side of the ceramic substrate. In such implementations, the template-locating features may define a template reference coordinate system that is aligned with the substrate reference coordinate system when the template is laid against the first side of the ceramic substrate and the one or more template-locating features are interfaced with the one or more reference features. The template may also include one or more component-locating features that are positioned at locations relative to the template reference coordinate system that are based, at least in part, on measured locations of the first drop-holes with respect to the substrate reference coordinate system.

In some such implementations of the apparatus, the template may be formed from a sheet of material. In some such implementations of the apparatus, the material of the sheet of material may be stainless steel alloy, aluminum alloy, plastic, fiberglass, printed circuit board substrate material, or ceramic.

In some implementations of the apparatus, the template may further include a resistive heater layer.

In some implementations of the apparatus, the template may further include an electrical interconnect layer including a plurality of conductive pathways that are electrically isolated from one another within the electrical interconnect layer and that are configured to communicate electrical signals between different locations in the template.

In some implementations of the apparatus, the template may further include one or more textual or graphical indicators indicating mounting locations for one or more of the first fluid-flow components.

In some implementations of the apparatus, the ceramic substrate may have poka-yoke receptacles in one or more locations on the first side and the template may not have openings in at least some locations with respect to the template reference coordinate system that correspond to the locations of the poka-yoke receptacles with respect to the substrate reference coordinate system.

In some implementations of the apparatus, the ceramic substrate also may have a plurality of second drop-holes formed in a second side of the ceramic substrate opposite the first side. In such implementations, with respect to the apparatus, at least some of the component-locating features are positioned at locations based on average measured locations for first and second drop-hole pairs with respect to the substrate reference coordinate system.

In some implementations, an apparatus is provided that includes a ceramic substrate and a first template. The ceramic substrate may include a plurality of first drop-holes formed in a first side of the ceramic substrate prior to sintering the ceramic substrate and one or more reference features formed after the ceramic substrate has been sintered. The first template may include one or more first template-locating features configured to interface with the one or more reference features of the ceramic substrate so as to locate the first template relative to the ceramic substrate when the first template is laid against the first side of the ceramic substrate, and one or more first component-locating features that are positioned with respect to a template reference coordinate system defined by the one or more first template-locating features based, at least in part, on measured positions of the first drop-holes relative to a substrate reference coordinate system defined by the one or more reference features. In such implementations, the first template may be laid against the first side of the ceramic substrate and the one or more first template-locating features may be interfaced with the one or more reference features, each first component-locating feature may be positioned over one of the first drop-holes, and each first component-locating feature may be configured to position one of a plurality of first fluid flow components relative to one or more of the first drop-holes when that first fluid flow component is mounted to the apparatus.

In some such implementations, the first template may be formed from a sheet of material. In some further such implementations, the material of the sheet of material may be stainless steel alloy, aluminum alloy, plastic, fiberglass, printed circuit board substrate material, or ceramic.

In some implementations of the apparatus, the first template may further include a resistive heater layer.

In some implementations of the apparatus, the first template may further include an electrical interconnect layer including a plurality of conductive pathways that are electrically isolated from one another within the electrical interconnect layer and that are configured to communicate electrical signals to one or more of the one or more first fluid flow components when the first fluid flow components are mounted to the ceramic substrate and the first template is interposed between the one or more of the one or more first fluid flow components and the ceramic substrate.

In some implementations of the apparatus, the first template may further include one or more textual or graphical indicators indicating mounting locations for one or more of the first fluid-flow components.

In some implementations of the apparatus, the ceramic substrate may also include poka-yoke receptacles in one or more locations on the first side and the first template may not have openings in at least some locations with respect to the template reference coordinate system that correspond to the locations of the poka-yoke receptacles with respect to the substrate reference coordinate system.

In some implementations of the apparatus, the ceramic substrate may further include one or more sets of first component-mounting features, each first component-mounting feature may be associated with one of the first component-locating features, and the first template may further include one or more sets of first component-mounting feature pass-throughs. Each first component-mounting feature pass-through may be associated with a different one of the first component-locating features, and each first component-mounting feature pass-through may be positioned such that that first component-mounting feature pass-through is col-located with the associated first component-locating feature when the template is laid against the ceramic substrate with the one or more first template-locating features interfaced with the one or more reference features.

In some implementations of the apparatus, the ceramic substrate further may include a plurality of second drop-holes in a second side of the ceramic substrate opposite the first side of the ceramic substrate. The apparatus, in such implementations, may further include a second template, and the second template may include one or more second template-locating features configured to interface with the one or more reference features of the ceramic substrate so as to locate the second template relative to the ceramic substrate, and one or more second component-locating features that are positioned with respect to a second template reference coordinate system defined by the one or more second template-locating features based, at least in part, on measured positions of the second drop-holes relative to the substrate reference coordinate system. In such implementations, each second component-locating feature may be configured to position a second fluid flow component relative to one or more of the second drop-holes when that second fluid flow component is mounted to the apparatus.

In some implementations of the apparatus, the first template and the second template may match with respect to the positions of the first and second template-locating features and the first and second component-locating features, respectively.

In some implementations, a method may be provided. The method may include forming a plurality of first drop-holes in a first side of a ceramic substrate, sintering the ceramic substrate after forming the plurality of first drop-holes in the first side of the ceramic substrate, forming one or more reference features in the ceramic substrate after the ceramic substrate has been sintered, measuring a two-dimensional location of each first drop-hole relative to a substrate reference coordinate system defined by the one or more reference features, forming one or more template-locating features in a template, the one or more template-locating features configured to interface with the one or more reference features so as to allow the template to be laid against the ceramic substrate and fixed in at least two dimensions relative to the ceramic substrate by interfacing the one or more template-locating features with the one or more reference features, and forming one or more component-locating features in the template, each component-locating feature positioned relative to a template reference coordinate system defined by the one or more template-locating features based, at least in part, on the measured location of one of the first drop-holes relative to the substrate reference coordinate system.

In some such implementations of the method, the method may also include storing the location of each component-locating feature relative to the template reference coordinate system in a non-volatile, computer-readable medium, receiving a request for a replacement template, retrieving, responsive to the request for a replacement template, the location of each component-locating feature relative to the template reference coordinate system from the non-volatile, computer-readable medium, forming one or more replacement template-locating features in a replacement template, the one or more replacement template-locating features configured to interface with the one or more reference features so as to allow the replacement template to be placed on the ceramic substrate and fixed in at least two dimensions relative to the ceramic substrate, and forming one or more replacement component-locating features in the replacement template, each replacement component-locating feature positioned relative to a replacement template reference coordinate system defined by the one or more replacement template-locating features at locations corresponding to the locations of the component-locating features relative to the template reference coordinate system retrieved from the non-volatile, computer-readable medium.

In some implementations of the method, the method may also include forming, prior to sintering the ceramic substrate, a plurality of second drop-holes in a second side of the ceramic substrate opposite the first side of the ceramic substrate, wherein there are at least some first drop-hole and second drop-hole pairs in which the second drop-hole in the pair is positioned in a location that corresponds with the location of the first drop-hole in the pair prior to the sintering, measuring the position of each second drop-hole relative to the one or more reference features, and determining, for each first and second drop-hole pair, an average location for the first drop-hole and the second drop-hole in the pair by interpolating between the location of the first drop-hole in the pair relative to the substrate reference coordinate system and the location of the second drop-hole in the pair relative to the substrate reference coordinate system, wherein forming the one or more component-locating features in the template includes forming at least some component-locating features at locations relative to the template reference coordinate system that correspond with corresponding average locations for the first drop-hole and second drop-hole pairs.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

The assignee of this disclosure has undertaken to fundamentally change the design of gas boxes for use in semiconductor manufacturing to make these systems more streamlined, more compact, and less expensive. One concept that was explored as part of this effort is a "monolithic manifold" design, in which a substantial fraction, or even all, of the valves, MFCs, and other fluid control components that are traditionally housed in the gas box are mounted to a common manifold block. This manifold block, which is formed into a single contiguous part that includes all (or at least a large portion) of the flow passages needed to communicate fluids between the various flow control components, as well as mounting features for mounting the associated fluid control components to the manifold block, is referred to as a monolithic manifold. It is to be understood that, as used herein, the term "fluid" may refer to either gas-phase or liquid-phase fluids (or combinations thereof, e.g., gases with fluid particles suspended within the gas). A gas box may, in addition to providing for the supply of process gases, also provide for the supply of liquid-phase processing chemicals.

In one particular concept, the monolithic manifold may be made from a ceramic material; this concept is referred to herein as a "ceramic monolithic manifold" or "CMM." The CMM may be manufactured, for example, by machining features, such as through-holes, fluid-flow vias, flow passages, etc., into several separate "green" ceramic layers that are then, after machining is complete, aligned, stacked, and bonded together. These features may also be formed using injection molding, dry pressing, or isostatic pressing. The bonded ceramic structure may then be sintered in a kiln or furnace to produce a fused, contiguous ceramic structure. During the sintering process, the ceramic may undergo significant contraction. As a result, any features that are desired in the finished ceramic part must be machined or formed in the green ceramic at a larger scale such that when the contraction occurs, these features shrink to the desired size and in the desired position for the final part. While ceramics manufacturers have developed techniques for compensating for such contraction effects, there is some variability in the amount of contraction that is experienced through a part, depending on the distribution of ceramic material and void space within the part. As a result, the tolerances that are achievable in such ceramic parts are limited, and post-sintering machining operations may be required in order to achieve higher feature precision. If large numbers of such operations must be performed, e.g., such as may be required for a component with a large number of high-precision mounting locations, the cumulative cost of such post-sintering machining may add unnecessarily and disproportionately to the total cost of the component.

Figure 2:
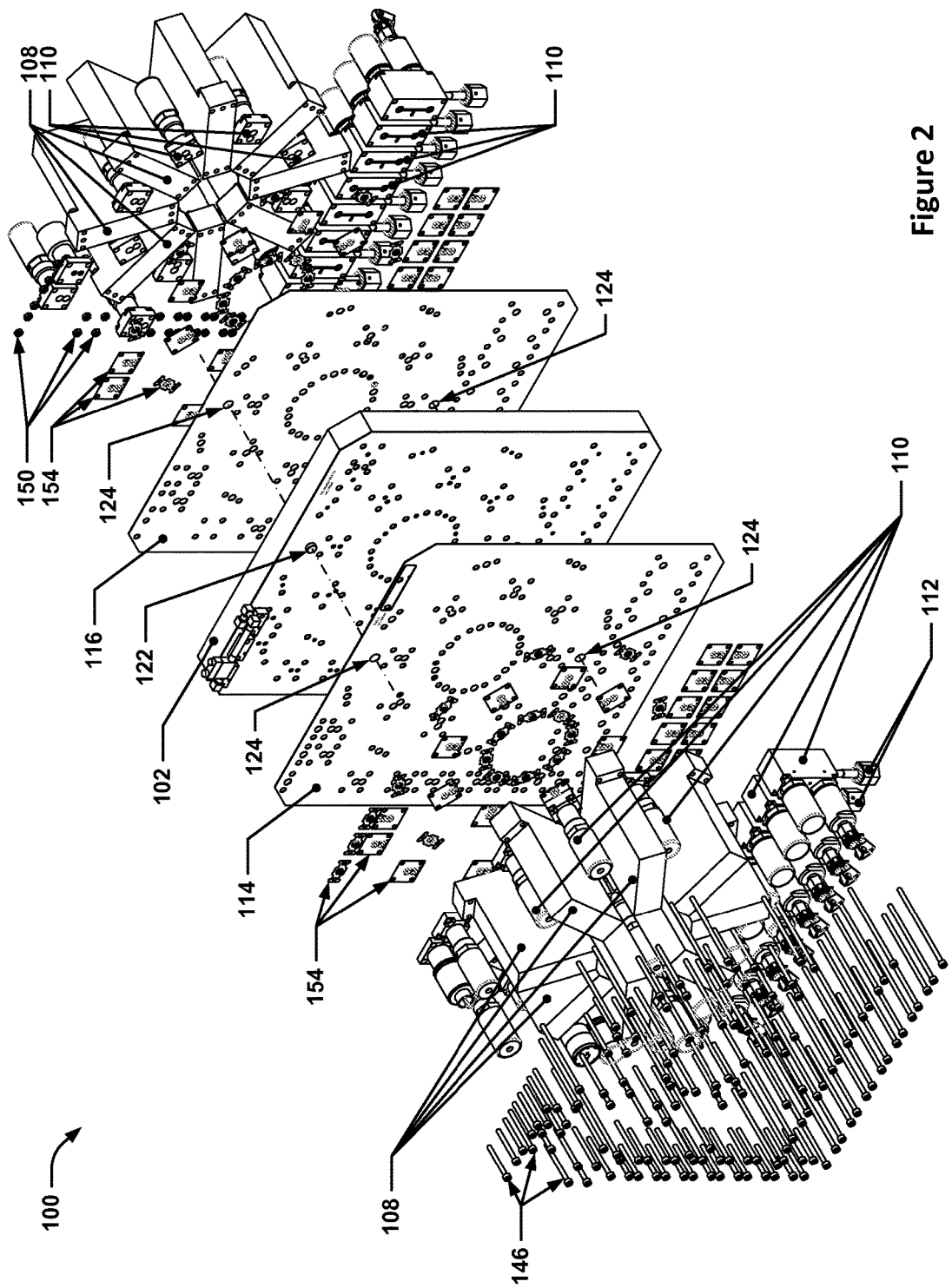
FIG. 2 depicts an isometric exploded view of the CMM of FIG. 1.

FIG. 1 depicts an isometric view of an example CMM design that accommodates at least sixteen separate processing gases (or liquids). As shown, the example CMM 100, in this case, includes a ceramic substrate 102 to which a plurality of MFCs 108 and valves 110 are connected. FIG. 2 depicts an isometric exploded view of the CMM 100. The ceramic substrate 102 is more clearly visible, as are the various fluid flow components, such as the MFCs 108 and the valves 110. As can be seen, one or more C-seal retainers 154 are interposed between each fluid flow component and the ceramic substrate 102. These C-seal retainers are thin metal components that include one or more metal C-seals that interface with a shallow bore feature on the fluid flow component and that are compressed between the fluid flow component and the ceramic substrate 102.

In this particular example implementation, the CMM 100 is largely symmetric front-to-back. For example, each MFC 108 has a corresponding MFC 108 located on the opposite side of the ceramic substrate 102. As a result, mounting screws 146 that are used to mount many of the fluid flow components to the ceramic substrate 102 may pass through a fluid flow component, the ceramic substrate 102, and through another, similar fluid flow component on the opposite side of the ceramic substrate 102; nuts 150 may then be threaded onto the mounting screws 146 to clamp the assembly together. In some implementations, some of the fluid flow components may have threaded holes or inserts in their bases into which the mounting screws 146 may be threaded (instead of separate nuts).

Also visible in FIGS. 1 and 2 are a first template 114 and a second template 116. The first template 114 and the second template 116, which may also be referred to as "masks" instead of "templates," may serve a number of important purposes, as discussed in more detail later in this disclosure. The first template 114 and the second template 116 are sandwiched in between the fluid flow components (and associated C-seal retainers 154) and the ceramic substrate 102. The reference features 122 may interface with template-locating features 124 on the first template 114 and the second template 116, and may serve to position the first template 114 and the second template 116 relative to the ceramic substrate 102 with a high degree of precision—a degree of precision that exceeds the as-sintered tolerances of the ceramic substrate 102.

Figure 3:
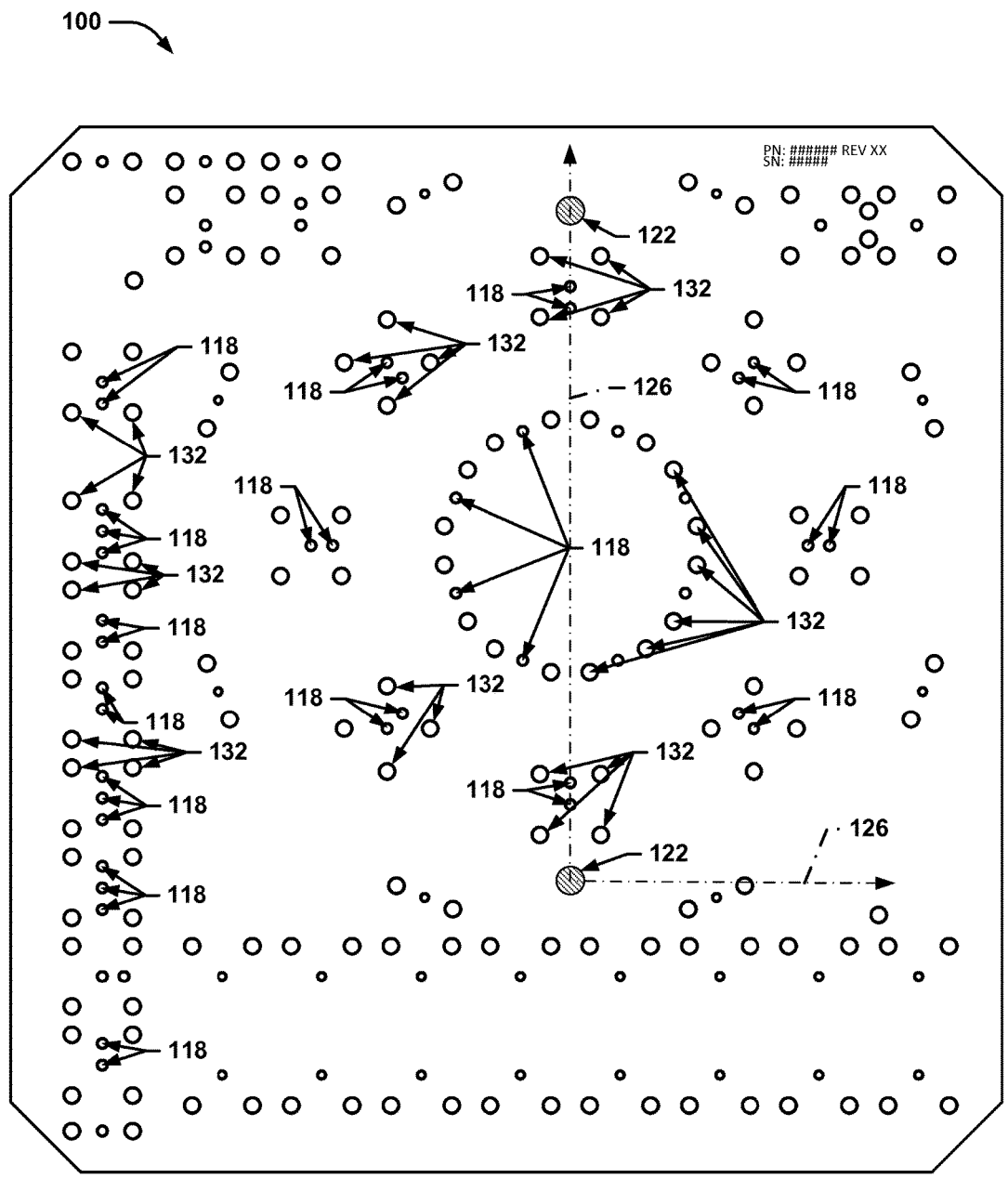
FIG. 3 depicts a plan view of the ceramic substrate of FIG. 1.

FIG. 3 depicts a plan view of the ceramic substrate 102. As is evident, there are a large number of features in the depicted first side 104; a large number of features may also be found in the second side (not depicted here, but on the opposite side of the ceramic substrate 102 from the first side 104). Many of the features on the first side 104 and the second side may be in corresponding locations.

For example, the ceramic substrate 102 that is depicted may have a number of first drop-holes 118 that are in locations where an internal fluid flow passage (not depicted) of the ceramic substrate 102 exits the ceramic substrate 102. The term "drop-hole," as used herein, refers to a hole that connects such an internal fluid flow passage to a corresponding fluid flow component, such as an MFC 108 or a valve 110. As each drop-hole represents a fluid flow transition between two discrete components, some form of seal is necessary around each drop-hole. One such sealing technology is a C-seal, which is a thin metal torus that has a radial slit about its outer circumference (thus, the cross-section of a C-seal looks like "⊃ C").

Figure 4:
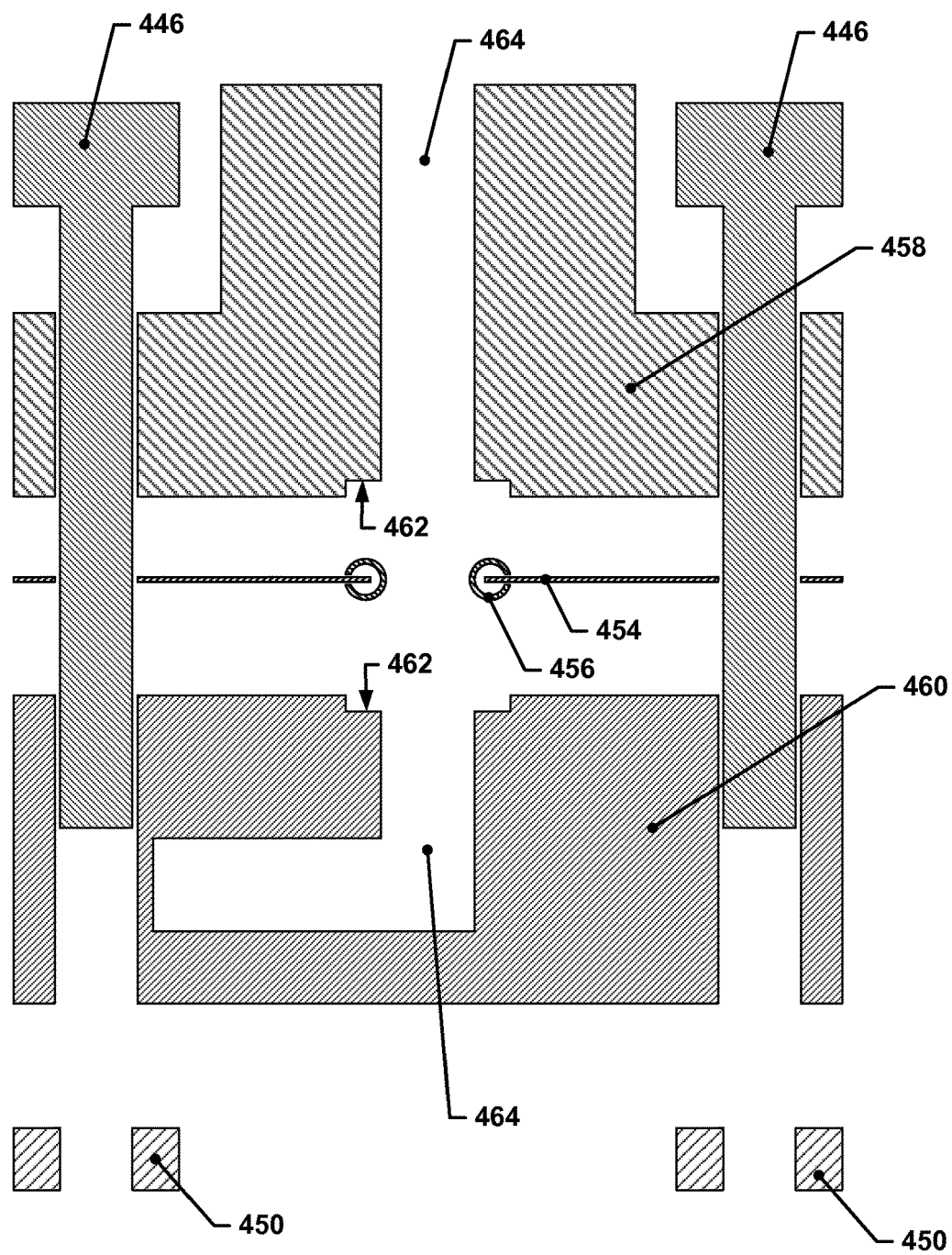
FIG. 4 depicts an exploded side section view of an example C-seal interface.
Figure 5:
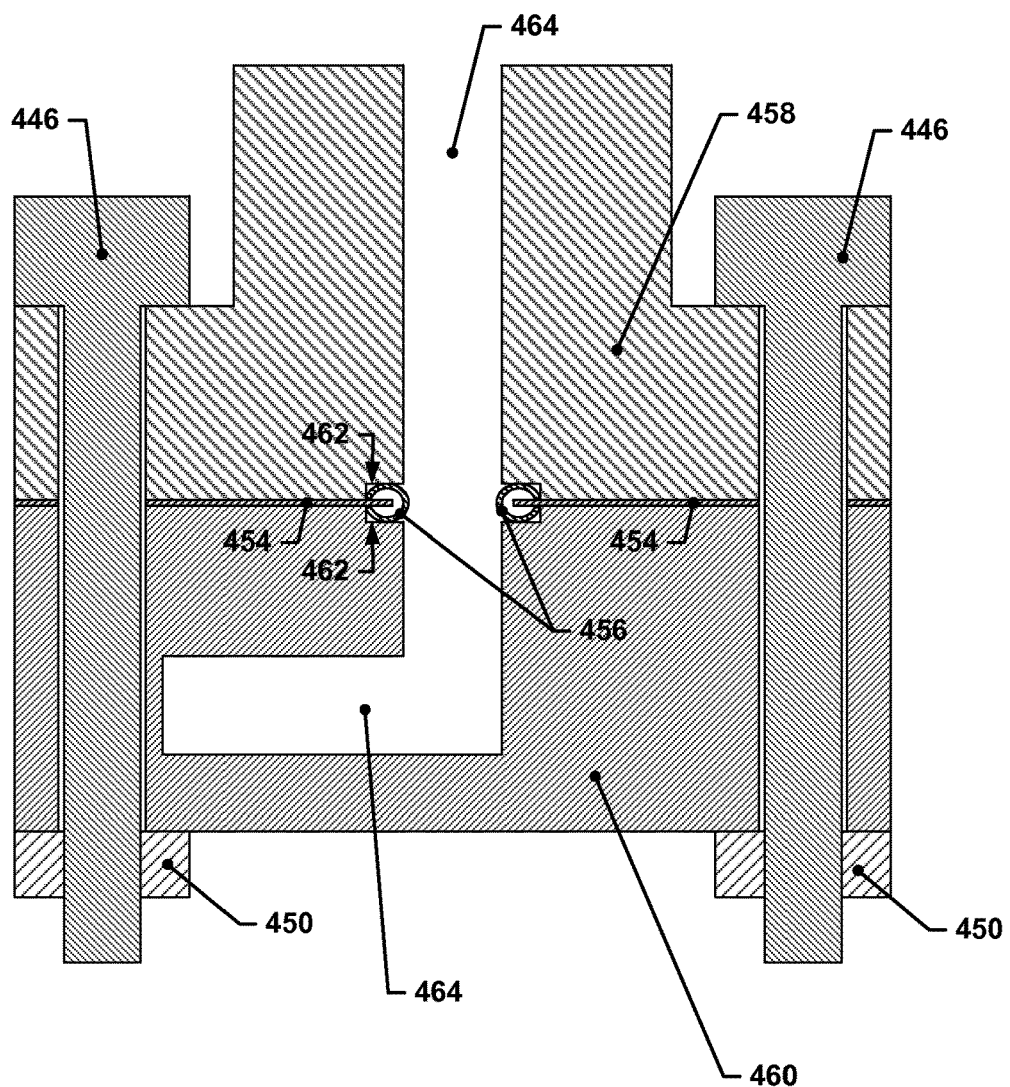
FIG. 5 depicts a side section view of the example C-seal interface of FIG. 4 in its assembled state.

FIG. 4 depicts an exploded side section view of an example C-seal interface. FIG. 5 depicts a side section view of the example C-seal interface of FIG. 4 in its assembled state. Visible in FIG. 4 are a first component 458 and a second component 460. The first component 458 and the second component 460 may be bolted together by mounting screws 446 and nuts 450. A fluid flow passage 464 may travel through both the first component 458 and the second component 460 (if the second component 460, for example, is similar to the ceramic substrate 102, then the fluid flow passage 464 would form a drop-hole where it exited the second component 460). As can be seen, a C-seal 456 is interposed between the first component 458 and the second component 460. The C-seal 456 is trapped by a C-seal retainer 454, which is not strictly necessary, but may allow for easier handling of the C-seal 456 and may prevent misalignment of the C-seal 456 during installation. The first component 458 and the second component 460 may each have counterbores 462 around the exit points for the fluid flow passage 464 within which the C-seal 456 may seat when the C-seal 456 is installed. The counterbores 462 may be precision-machined such that the C-seal 456 is located with a high degree of precision relative to the fluid flow passage 464. This causes the C-seal 456 to be concentric with the fluid flow passage 464 and minimizes the risk that a portion of the C-seal 456 will extend past the outer edge of the fluid flow passage 464 and into the fluid flow passage 464, where it may negatively impact fluid flow within the fluid flow passage 464. As can be seen in FIG. 5, when the C-seal interface is assembled, the C-seal 456 is compressed between the counterbores 462 and deforms to provide a gas-tight seal.

Returning to FIG. 3, it may be observed that there are, contrary to what is depicted in FIGS. 4 and 5, no counterbores associated with any of the first drop-holes 118. While it would certainly be possible to add such counterbore features to the ceramic substrate 102, the present inventors determined that doing so introduced unnecessary cost to manufacturing the ceramic substrate 102. Due to the tolerance drift experienced during sintering of the ceramic substrate 102, such counterbores would need to be added after the ceramic substrate 102 had been sintered. While "green" (unsintered) ceramics are relatively easy to machine, sintered ceramics are more difficult to machine. Machining a counterbore feature for each first drop-hole 118 post-sintering would introduce a significant extra cost to manufacturing the ceramic substrate 102. As such, nearly all of the features shown on the ceramic substrate 102 are green-machined features. The present inventors determined that it may, in some cases, only be necessary to perform one or two types of post-sintering machining operations on a ceramic substrate such as the ceramic substrate 102 in order to provide a CMM 100 (or, at least, to provide features that allow for precise mounting of the various fluid flow components that will be attached to the CMM 100). First, the first side 104 (and potentially the second side, if seal interfaces are present on the second side) of the ceramic substrate 102 may be polished or lapped to a high degree of smoothness, e.g., 5-35 Ra surface roughness. This polishing may be applied to the entire first side 104 and/or second side, or may be confined to only the areas immediately surrounding the drop-holes 118. This polishing operation provides a sufficiently smooth sealing surface that allows the C-seals to properly seal. The other machining operation that may be performed is to precision-machine one or more of the reference features 122 (or machine features allowing such reference features 122 to be installed) that are later used to locate the first template 114 and the second template 116 relative to the ceramic substrate 102. The reference feature or features 122 may define a substrate reference coordinate system 126. In some implementations, the reference features may be bonded or otherwise affixed to the CMM 100 using features in the CMM 100 that are not precision machined, e.g., the CMM 100 may be designed to have over-sized holes after sintering into which precision-machined pins may be inserted and bonded. Thus, the reference features may be fixed, once installed, with respect to the CMM 100 in order to provide a fixed reference frame relative to the CMM 100.

The ceramic substrate 102 may also include a number of component-mounting features 132 that are, in this example, through-holes that allow a bolt or screw to be passed through the ceramic substrate 102 and one or two fluid flow components in order to mount those fluid flow components to the ceramic substrate 102. While such features may also be internally-threaded features, e.g., threaded metal inserts installed into the ceramic substrate 102, simple through-holes may provide the most cost-effective mechanism for effecting such component mounting, as such features may be green-machined and may not require any post-sintering machining operations.

Due to various factors, it may be desirable to mount each fluid flow component to the ceramic substrate 102 such that the corresponding first drop-holes 118 (or second drop holes) are precisely aligned with the counterbore(s) present in each fluid flow component. Since the first drop-holes 118 are immovable, the present inventors determined that a locating mask or template could be used, in conjunction with the C-seals, to precisely locate each fluid flow component with respect to the corresponding first drop-holes 118. If the fluid flow component seal-locating counterbores (or the seals) cannot be precisely aligned with the drop-holes, then it may be necessary to reduce the diameter of the drop-holes such that any potential misalignment of the fluid flow components/seals with respect to the drop-holes does not cause the seal contact area to overlap with the drop-hole, which could damage the seal and/or cause leaks.

Figure 6:
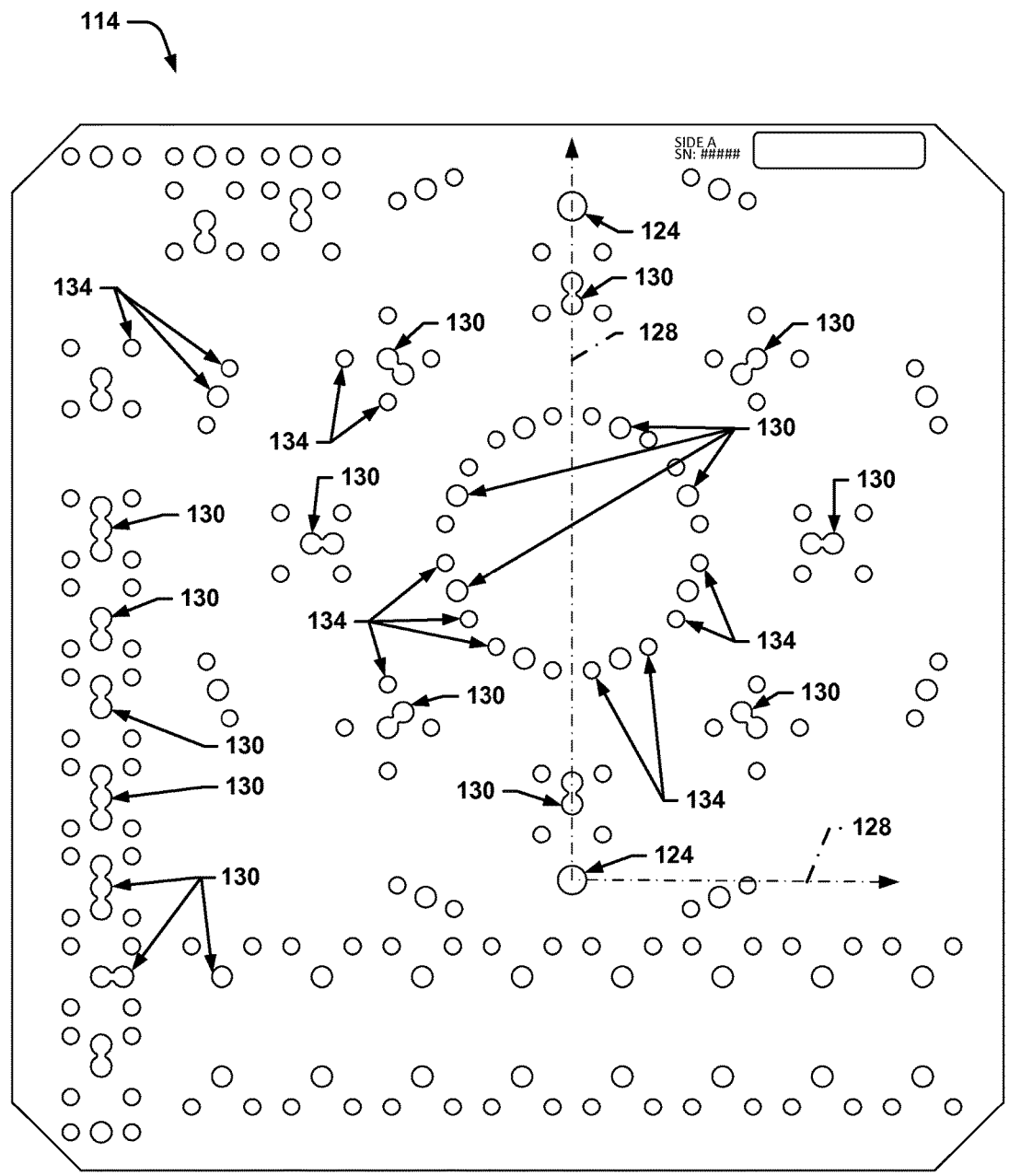
FIG. 6 depicts a plan view of the first template of FIG. 1.

FIG. 6 depicts a plan view of the first template 114. As can be seen, the first template 114 includes a hole pattern that largely mimics the hole/feature pattern that is present on the ceramic substrate 102. In fact, a template such as the first template 114 may actually be custom-machined (or otherwise formed) based on measured locations of the first drop-holes 118 in the ceramic substrate 102 relative to the substrate reference coordinate system 126. For example, the first template 114 may have one or more template-locating features 124 that are machined (or otherwise formed) to be in the same relative configuration as the reference feature(s) 122 of the ceramic substrate 102; these template-locating features 124 may define a template reference coordinate system 128. The first template 114 may also have a plurality of component-locating features 130 that, for example, are each positioned relative to the template reference coordinate system 128 based on the measured locations of corresponding first drop-holes 118 relative to the substrate reference coordinate system 126. The component-locating features 130 may be sized so as to, in effect, replace the counterbores 462 that may normally be used to locate a C-seal 156.

The first template 114 may also include a number of component-mounting feature pass-throughs 134 that correspond in placement with the locations of the component-mounting features 132 of the ceramic substrate 102. The first template 114 may also include markings, such as the "Side A" marking in the upper right corner, as well as openings permitting similar markings on the ceramic substrate 102 (see rectangular slot to right of "Side A" marking) to be seen.

Figure 7:
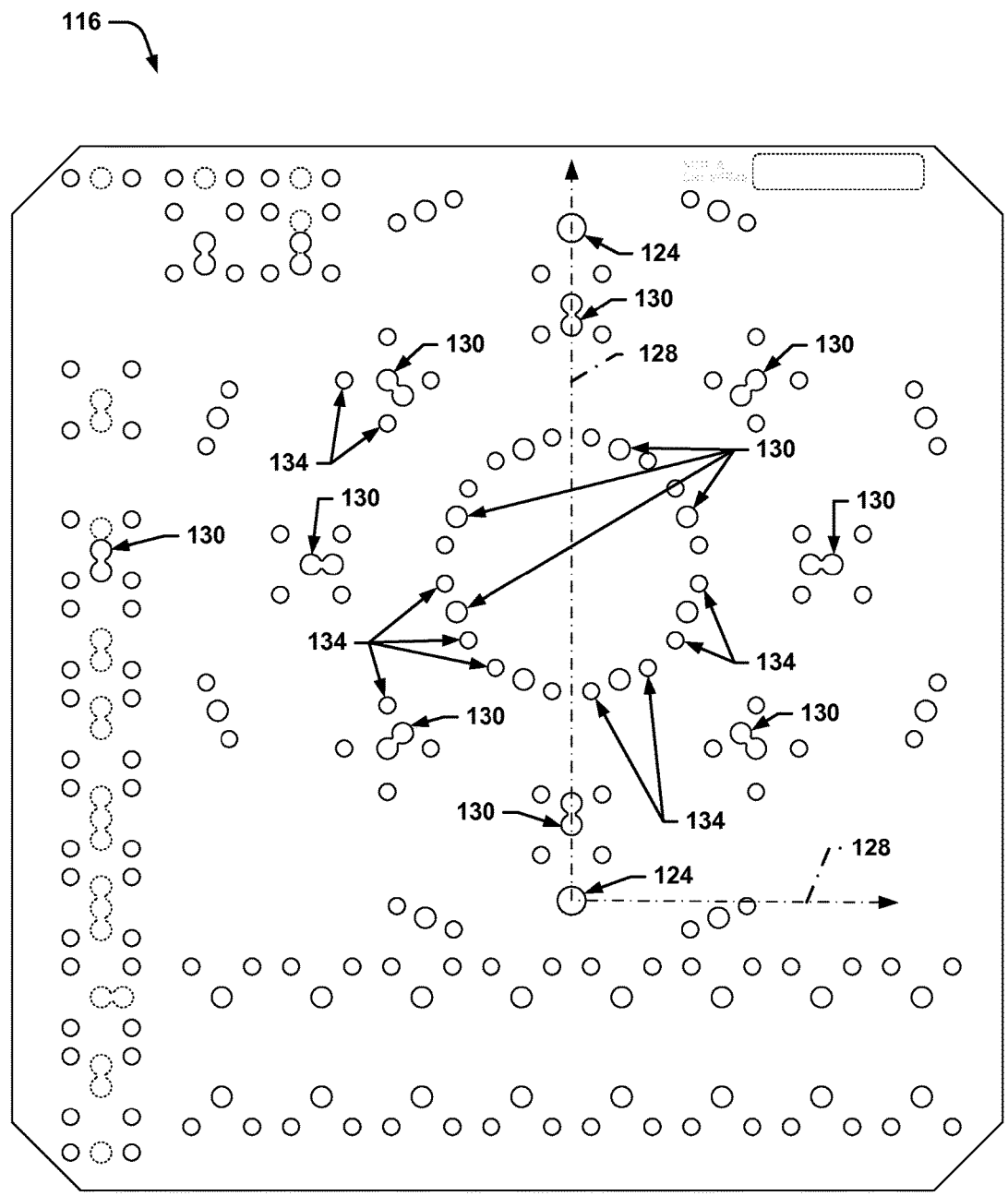
FIG. 7 depicts a plan view of the second template of FIG. 1.

Since the first template 114 is made of a material such as stainless steel, aluminum, or other easily machinable material (relative to the machinability of the sintered ceramic substrate), it is economically feasible to precision machine the component-locating features 130 and the component-mounting feature pass-throughs 134 in the first template 114. FIG. 7 depicts a plan view of the second template 116, which shares many features with the first template 114. For comparison, features from the first template 114 are shown in dotted lines; as can be seen, there is substantial overlap between both templates. In some implementations, both the first template 114 and the second template 116 may be identical (although perhaps marked with different part numbers or identifiers), allowing for a single template design to be specified for a given ceramic substrate. This common template may then be manufactured in duplicate and assembled to the ceramic substrate.

As each instance of a ceramic substrate 102 that is sintered may exhibit slightly different shrinkage behavior due to various factors, the present inventors determined that the first template 114 and the second template 116 could be custom-manufactured for each ceramic substrate 102 that was sintered. In this manner, the valves 110, MFCs 108, and various other components mounted to a particular ceramic substrate 102 may be precisely located relative to the actual locations of the drop-holes of that particular ceramic substrate 102.

Figure 8:
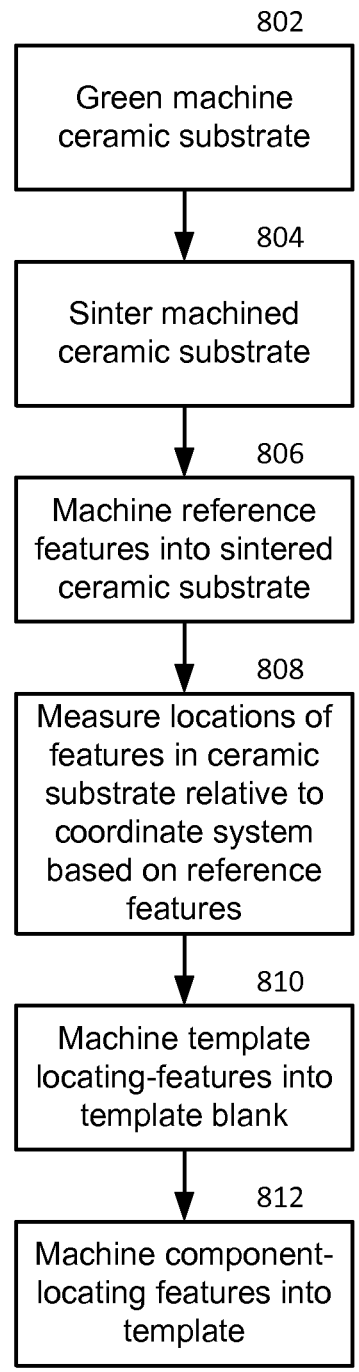
FIG. 8 is a flow diagram for a process for manufacturing a template for use with a ceramic substrate.

FIG. 8 is a flow diagram for a process for manufacturing a template for use with a ceramic substrate. In block 802, a ceramic substrate is green-machined such that it includes a plurality of drop-holes and component-mounting features, e.g., through-holes. This green-machining occurs prior to sintering of the ceramic substrate. The green-machining may involve machining multiple layers of ceramic material that are then stacked together and bonded to form the ceramic substrate.

In block 804, the ceramic substrate may be fired in a kiln or furnace to sinter the ceramic material. During this sintering process, the ceramic substrate will shrink in overall size, and the features machined into the ceramic substrate will displace from their as-machined positions and will also potentially experience other types of dimensional drift.

In block 806, the sintered ceramic substrate may be machined in its post-sintered state. In this post-sintering machining, the ceramic substrate may have one or more reference features that are machined into the sintered ceramic substrate (or installed into features machined into the ceramic substrate). The number and type of these reference features may vary. In the examples discussed herein, the reference features take the form of pairs of precision-machined pins that are inserted into bores through the ceramic substrate and then bonded into place relative to the ceramic substrate. In some implementations, the features in the ceramic substrate that interface with the reference features may be precision-machined and such pins may then be installed and locked in place in a removable manner, e.g., by using a threaded nut of some type on one end. The function of the reference features is to provide a "fixed" frame of reference for the ceramic substrate against which the locations of all of the other features in the ceramic substrate, e.g., the drop holes, may be measured. The reference features also serve as physical interfaces that locate the first template (and second template, if used) relative to the ceramic substrate. As part of the post-sintering machining, the ceramic substrate may also be subjected to polishing, if necessary, although such polishing operations may also occur at a later time, if desired.

It is to be understood that, in some implementations, the "post-sintering" machining may simply involve installing a machined component, such as a locating pin, into a feature of the ceramic substrate that was created in the green-machining phase and then subjected to the sintering process. In such implementations, the feature in the ceramic substrate may not be a precision-machined feature, but may instead have as-fired tolerances resulting from the sintering process. In such cases, the tolerance gap between the reference feature and the feature in the ceramic substrate that interfaces with the reference feature may be dealt with, as discussed earlier, by bonding the reference feature into the feature in the ceramic substrate that interfaces with the reference feature. In the end, the ceramic substrate is left with one or more reference features that are, for all practical purposes, fixed in space relative to the ceramic substrate.

In block 808, the sintered ceramic substrate may be inspected using automated metrology equipment, e.g., a machine vision or laser scanning system. As part of this measurement process, a substrate reference coordinate system may be defined relative to the reference features; this reference coordinate system may, for example, be centered on one of the reference feature(s) or on a part of the reference feature(s). It is to be understood that the substrate reference coordinate system may be centered in any location in a plane parallel to the surface of the ceramic substrate on which the fluid flow components will be mounted. Once the substrate reference coordinate system is established, the relative locations of each other feature, e.g., drop-holes, component-mounting features, etc., relative to the substrate reference coordinate system may be measured by the automated metrology equipment (manual metrology equipment may also be used, although this would be more time-consuming). In the end, a data file may be produced that includes information allowing the relative locations of every drop-hole and component-mounting feature in the ceramic substrate, as well as the reference feature(s), to be determined.

In block 810, a template blank, e.g., a thin sheet of stainless steel, may be machined (or otherwise processed, e.g., by laser cutting or by stamping) so as to include one or more template-locating features. Such template-locating features may correspond in number, shape, type, and relative location to the number, shape, type, and relative location of the reference features in the ceramic substrate. For example, in the examples discussed herein, there are two reference pins that are installed in the ceramic substrate. Each template includes two precision-machine holes through which the reference features may protrude when the template is placed against a side of the ceramic substrate. The reference features may thus prevent the templates from sliding laterally relative to the ceramic substrate.

In block 812, the template blank may be machined to add a plurality of component-locating features. Each component-locating feature may be located, relative to the template-mounting features, at a location that corresponds with the measured location of a corresponding feature on the ceramic substrate relative to the reference features. In this manner, the relative locations of all of the drop-holes in the ceramic substrate may be transferred to the template.

The component-locating features are intended to precisely locate the various fluid flow components that may be mounted to the ceramic substrate relative to the drop-holes that allow fluids to flow between passages in the ceramic substrate and the fluid flow components (or vice versa). Thus, when the template is installed on the ceramic substrate (and its position locked in place by the reference features), each component-locating feature may, for example, be centered on one of the drop-holes (or other feature where precise placement is of importance).

The fluid flow components may have features that either interface directly with the component-locating features, e.g., a raised boss that may have a high-precision fit within the component-locating feature, or may have features that interface indirectly with the component-locating feature, e.g., a counterbore that receives a C-seal. In the latter implementation, the C-seal may seat precisely in the counterbore of the fluid flow component, and may protrude out from the surface of the fluid flow component that mounts against the template/ceramic substrate assembly such that the C-seal then interfaces with the component-locating feature in the template at that location. In this manner, each fluid flow component (and, if used, each separate C-seal) is located precisely with respect to its respective drop-hole (or drop-holes).

Figure 9:
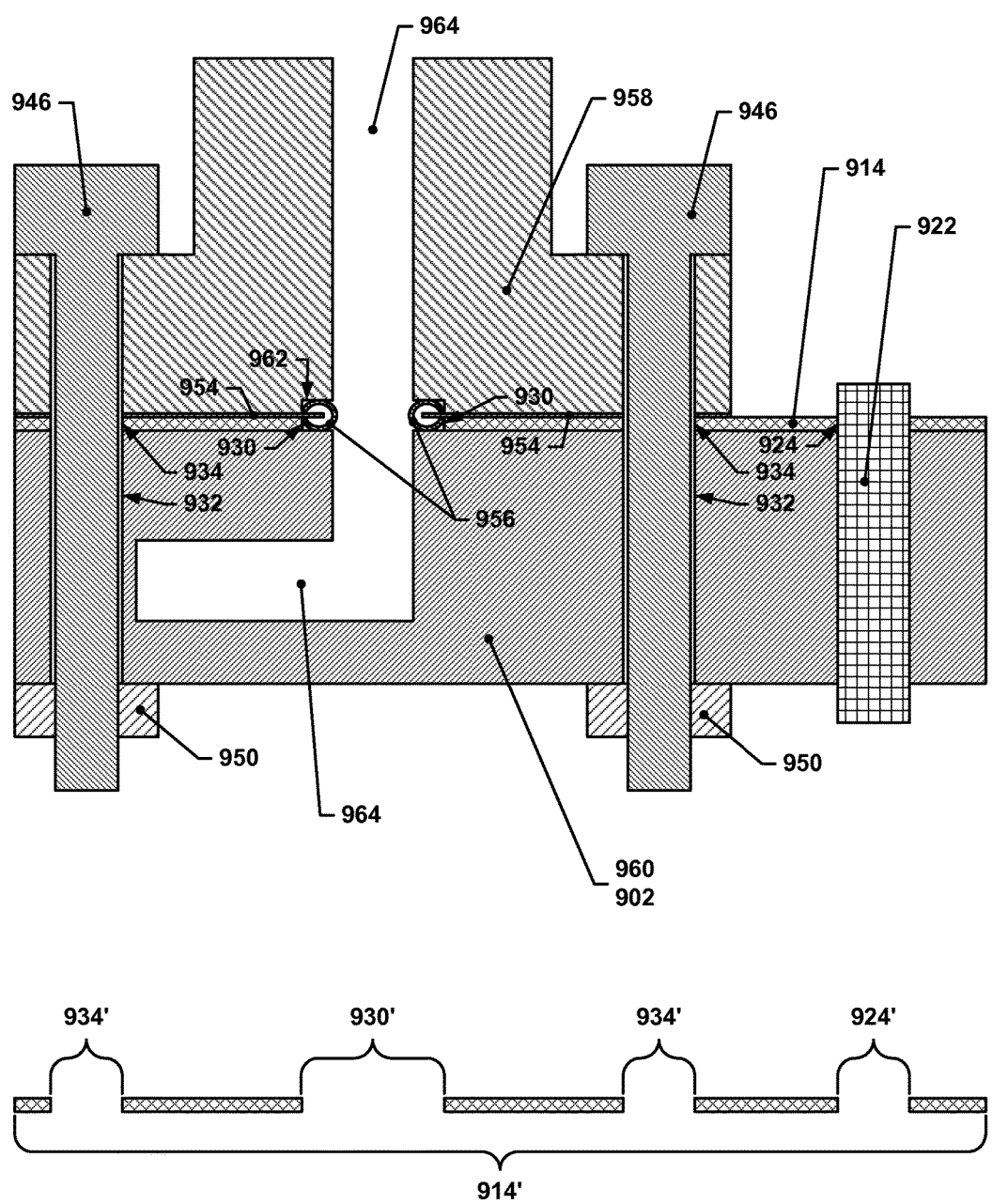
FIG. 9 depicts a removed section view of a portion of an example ceramic monolithic manifold.

FIG. 9 depicts a removed section view of a portion of an example ceramic monolithic manifold. A first component 958, which may be a valve, MFC, or other fluid flow component, may be clamped to a second component 960, which may be a ceramic substrate 902, using mounting screws 946 and nuts 950. The first component 958 and the second component 960 may have a fluid flow passage 964 that passes through both components. A C-seal 956 may seal the interface between the first component 958 and the second component 960 where the fluid flow passage 964 bridges between the two components. The C-seal 956 may be held in place by a C-seal retainer 954, in some implementations. The C-seal 956 may nestle into a counterbore 962 in the first component 958, which may serve to locate the C-seal 956 such that it is concentric with the fluid flow passage 964.

Also visible in FIG. 9 is a first template 914; the first template 914 has a number of holes or cutouts through it, such as a template-locating feature 924, a component-locating feature 930, and two component-mounting feature pass-throughs 934. For additional clarity, the first template 914 is also shown separately in the lower half of FIG. 9 with identical callouts (although a prime symbol (') has been added to the callouts for this separately-depicted instance).

The component-locating feature 930, when the first template 914 is placed against the ceramic substrate 902, forms, in conjunction with the ceramic substrate 902, a counterbore feature. The C-seal 956 may be nestled into this two-piece counterbore feature—the first template 914 thus provides precise lateral positioning of the C-seal 956 relative to the ceramic substrate 902. The first template 914 may, in turn, be precisely positioned with respect to the ceramic substrate 902 through the interface between the template-locating feature 924 and the reference feature 922 (which may, in some implementations, be permanently affixed to the ceramic substrate 902). While only one reference feature 922 is shown, in actual practice, more than one reference feature 922 may be used in order to prevent potential rotational movement between the ceramic substrate 902 and the first template 914. It is also to be understood that while the depicted implementation features only the first template 914, if fluid flow components are to be mounted on the other side of the ceramic substrate 902, a second template may be used on that other side. Even if no fluid flow components are to be mounted on the other side of the ceramic substrate 902, a second template may still be used so that any mounting screws 946 or nuts 950 that bear on the ceramic substrate 902 do not bear on the ceramic substrate 902 directly, but instead by way of a load that is distributed through the first template 914 and/or second template 916.

In many implementations, e.g., such as in the CMM 100, many of the drop-holes on one side of a ceramic substrate may have correspondingly-located drop-holes on the other side of the ceramic substrate. Accordingly, as discussed earlier, the first template and the second template for a ceramic substrate may have large numbers of features that are positioned in approximately the same locations. While it is possible in such cases to make a specific first template for a first side of the ceramic substrate and a specific second template for a second side of the ceramic substrate, it may be desirable to simply make two copies of one template, each of which can be used as either the first template or the second template. This reduces the chance that the side-specific templates (which may look very similar) may be used on the wrong side, and also reduces the logistical burden of managing two different parts.

Figure 10:
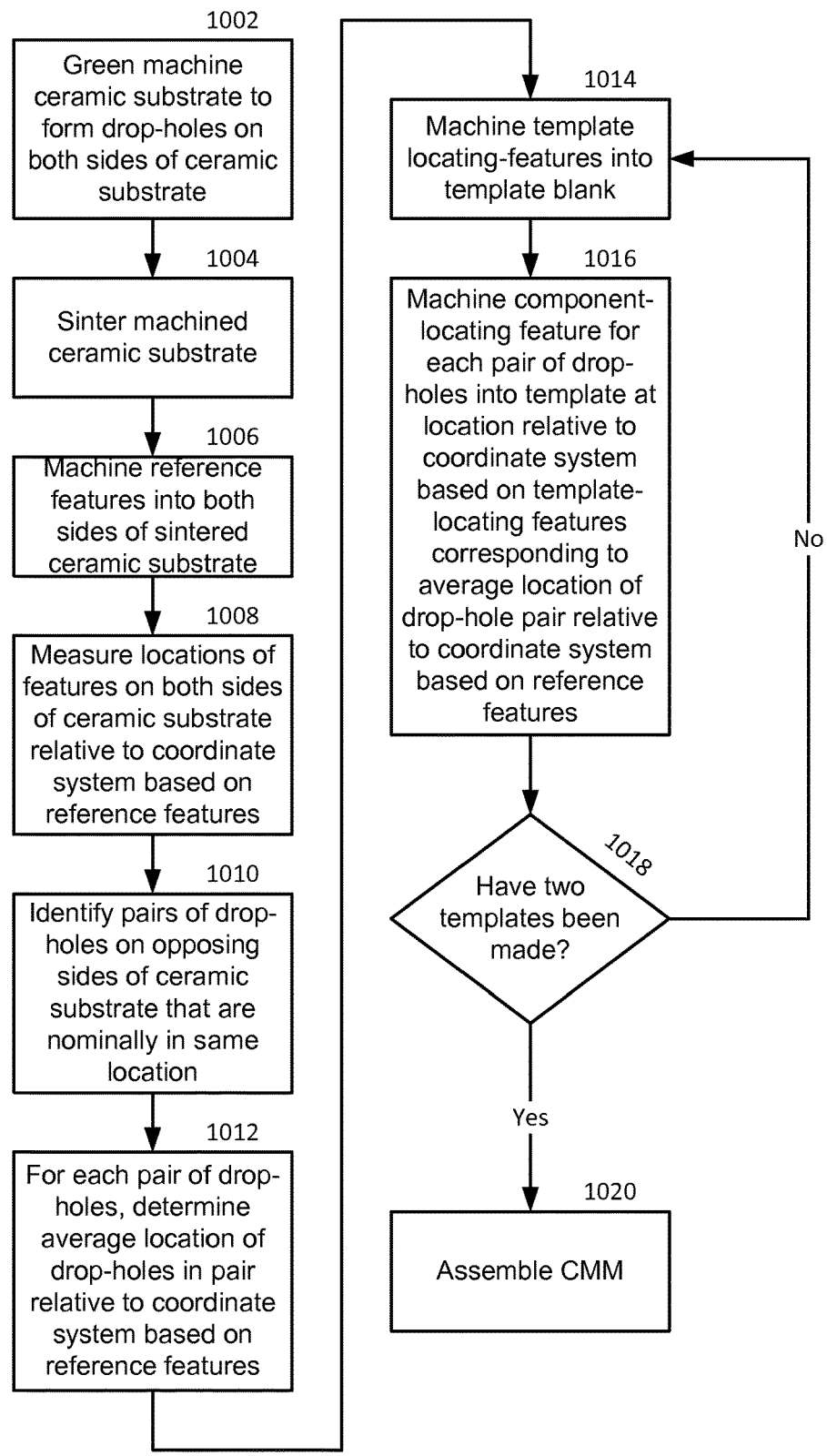
FIG. 10 depicts a flow diagram of a technique for making a template suitable for use on either side of a ceramic substrate.

FIG. 10 depicts a flow diagram of a technique for making a template suitable for use on either side of a ceramic substrate. In this particular example, each template is an identical copy of the other, although one or both templates may actually include additional component-mounting features or other features that are only used when the template is mounted to a particular side of the ceramic substrate.

The technique of FIG. 10 begins in block 1002, in which a ceramic substrate is green-machined such that it includes a plurality of drop-holes and component-mounting features, e.g., through-holes. This green-machining occurs prior to sintering of the ceramic substrate. The green-machining may involve machining multiple layers of ceramic material that are then stacked together and bonded to form the ceramic substrate. The resulting machined ceramic, in this case, will have drop-holes on both sides of the ceramic substrate (as well as component-mounting features).

In block 1004, the ceramic substrate may be fired in a kiln or furnace to sinter the ceramic material. During this sintering process, the ceramic substrate will shrink in overall size, and the features machined into the ceramic substrate will displace from their as-machined positions and will also potentially experience other types of dimensional drift.

In block 1006, the sintered ceramic substrate may be machined in its post-sintered state. In this post-sintering machining, the ceramic substrate may have one or more reference features that are machined into the sintered ceramic substrate (or installed into features machined into the ceramic substrate). As discussed with respect to the technique of FIG. 8, the number and type of these reference features may vary. In the examples discussed herein, the reference features take the form of pairs of precision-machined pins that are inserted into bores through the ceramic substrate and then bonded into place relative to the ceramic substrate. In some implementations, the features in the ceramic substrate that interface with the reference features may be precision-machined and such pins may then be installed and locked in place in a removable manner, e.g., by using a threaded nut of some type on one end. The function of the reference features is to provide a "fixed" frame of reference for the ceramic substrate against which the locations of all of the other features in the ceramic substrate, e.g., the drop holes, may be measured. The reference features also serve as physical interfaces that locate the first template (and second template, if used) relative to the ceramic substrate. As part of the post-sintering machining, the ceramic substrate may also be subjected to polishing, if necessary, although such polishing operations may also occur at a later time, if desired.

As discussed earlier, it is to be understood that, in some implementations, the "post-sintering" machining may simply involve installing a machined component, such as a locating pin, into a feature of the ceramic substrate that was created in the green-machining phase and then subjected to the sintering process. In such implementations, the feature in the ceramic substrate may not be a precision-machined feature, but may instead have as-fired tolerances resulting from the sintering process. In such cases, the tolerance gap between the reference feature and the feature in the ceramic substrate that interfaces with the reference feature may be dealt with, as discussed earlier, by bonding the reference feature into the feature in the ceramic substrate that interfaces with the reference feature. In the end, the ceramic substrate is left with one or more reference features that are, for all practical purposes, fixed in space relative to the ceramic substrate.

In block 1008, the sintered ceramic substrate may be inspected using automated metrology equipment, e.g., a machine vision or laser scanning system, similar to block 808 (such inspection may also be done manually, although this will be less efficient). As part of this measurement process, a substrate reference coordinate system may be defined relative to the reference features; this reference coordinate system may, for example, be centered on one of the reference feature(s) or on a part of the reference feature (s). It is to be understood that the substrate reference coordinate system may be centered in any location in a plane parallel to the surface of the ceramic substrate on which the fluid flow components will be mounted. Once the substrate reference coordinate system is established, the relative locations of each other feature, e.g., drop-holes, component-mounting features, etc., relative to the substrate reference coordinate system may be measured by the automated metrology equipment (manual metrology equipment may also be used, although this would be more time-consuming). In the end, a data file may be produced that includes information allowing the relative locations of every drop-hole and component-mounting feature in the ceramic substrate, as well as the reference feature(s), to be determined.

It is to be understood that in block 1008, both sides of the ceramic substrate are inspected and the locations of first drop-holes on a first side of the ceramic substrate and the locations of second drop-holes on a second side of the ceramic substrate (as well as the locations of any other features that are present on the ceramic substrate and are to be transferred to the template) are measured relative to the substrate reference coordinate system. As generally only the two-dimensional locations of the various measured features on the ceramic substrate are needed, the same reference coordinate system may be used when measuring features on both sides of the ceramic substrate.

In block 1010, pairs of first drop-holes and second drop-holes that are located in generally the same locations on opposing sides of the ceramic substrate may be identified. For example, for each feature measured on a first side of the ceramic substrate, a determination may be made as to which feature on the second side of the ceramic substrate is closest in location to that feature; these two features may then be viewed as a pair of corresponding features.

Figure 11:
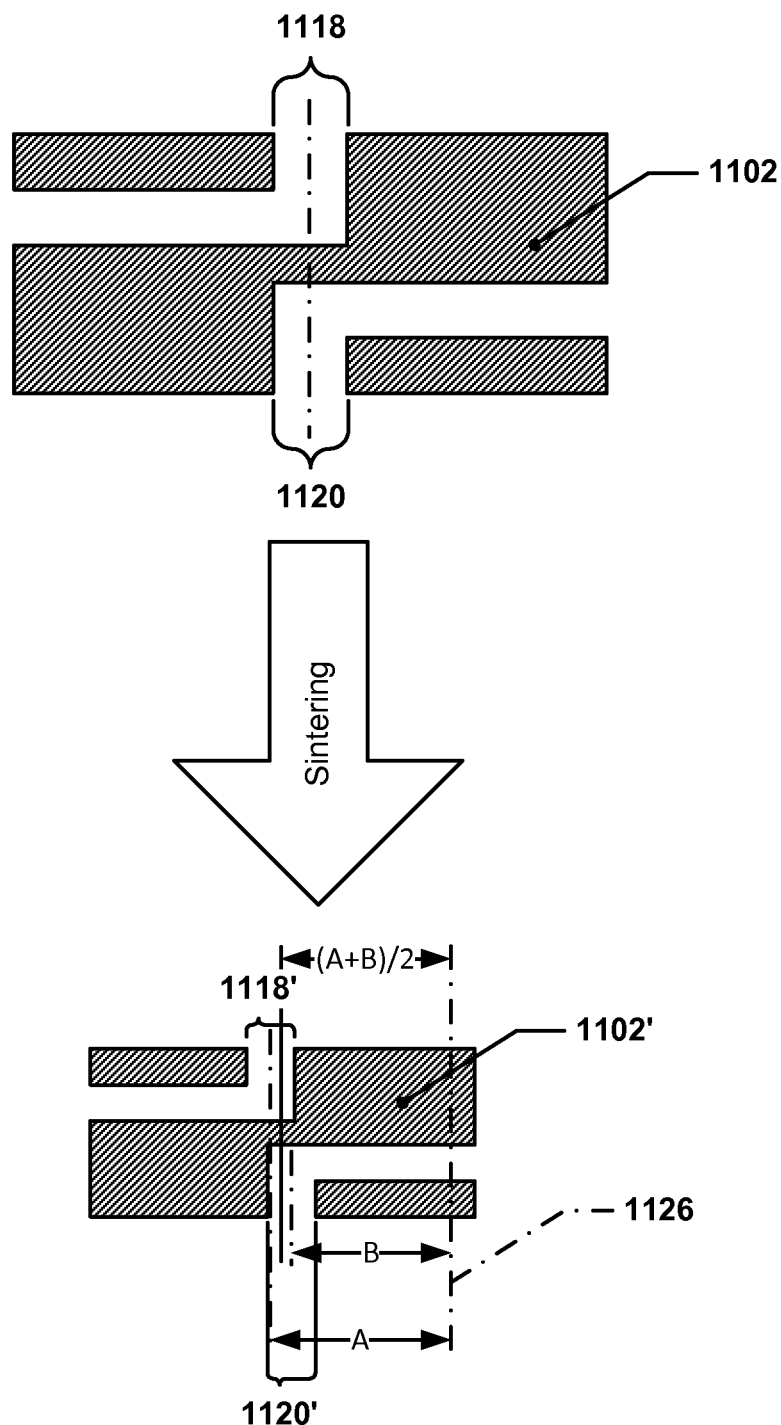
FIG. 11 depicts a removed section view of a ceramic substrate for the purposes of illustrating an average location determination.

In block 1012, an average location is determined for each pair of features identified in block 1010. FIG. 11 depicts a removed section view of a ceramic substrate for the purposes of illustrating an average location determination. In FIG. 11, a ceramic substrate 1102 is shown in both a green-machined, pre-sintered state (upper portion of Figure) and in a post-sintered state (lower portion of Figure). In the green-machined, pre-sintered state, the ceramic substrate 1102 has a first drop-hole 1118 and a second drop-hole 1120 that are co-axial with one another. After sintering, however, the ceramic substrate (now ceramic substrate 1102') has contracted. Due to a non-uniform contraction rate, as well as potential warpage, within the ceramic substrate 1102', the first drop-hole 1118' and the second drop-hole 1120' are no longer coaxial with one another.

As can be seen, the first drop-hole 1118' is a distance "A" from a substrate reference coordinate system 1126 axis, and the second drop-hole 1120' is a distance "B" from the substrate reference coordinate system 1126 axis. The average location for the first drop-hole 1118'/second drop-hole 1120' pair is thus $(A+B)/2$. A similar evaluation may be performed in a direction normal to the plane of FIG. 11 in order to obtain the average location in two dimensions. Similar average location determinations may be made for single features as well, e.g., through-holes such as may be used for component-mounting features may not be perfectly straight (or follow a path that is truly perpendicular to the ceramic substrate surfaces that they span between) as they traverse the thickness of the ceramic substrate. Accordingly, the holes where such features may exit the ceramic substrate may be in slightly difference locations between the two sides of the ceramic substrate, despite both holes arising from a single common feature. In such cases, the average location of such exit holes may be used to locate the corresponding feature, e.g., a component-mounting feature pass-through, on the templates.

In block 1014, a template blank, e.g., a thin sheet of stainless steel, may be machined (or otherwise processed, e.g., by laser cutting or by stamping) so as to include one or more template-locating features. Such template-locating features may correspond in number, shape, type, and relative location to the number, shape, type, and relative location of the reference features in the ceramic substrate. A template reference coordinate system may be established relative to the template-locating features; the template reference coordinate system may, in effect, be a duplicate of the substrate reference coordinate system.

In block 1016, component-locating features may be machined into the template blank at locations relative to the template reference coordinate system that correspond to the average locations for pairs of first drop-holes/second drop-holes with respect to the substrate reference coordinate system. Similarly, component-mounting feature pass-throughs may be machined into the template blank at locations relative to the template reference coordinate system that correspond to the average locations of component-mounting features with respect to the substrate reference coordinate system.

In block 1018, a determination may be made as to whether two or more templates have been made—if so, then the technique may proceed to block 1020, in which the templates may be assembled with the ceramic substrate and various fluid flow components to produce the CMM. If two or more templates for the ceramic substrate in question have not been made, then the technique may return to block 1014. It is to be understood that since the templates for a give ceramic substrate in such a technique may be identical, it is possible to machine both templates simultaneously, e.g., two template blanks may be stacked on top of one another and machined at the same time.

If paired, generally identical templates are used, the drop-holes in the CMM may need to be sized smaller than the maximum diameter supported by the seals that are to be used to seal fluid flow components to the CMM. Since each seal may be located relative to the corresponding drop-hole with a slight displacement (due to the use of the "average" location between corresponding drop-holes on opposite sides of the CMM), the drop hole diameter may need to be sized smaller than it ordinarily would to prevent the seal contact area from crossing over the lip of the drop-hole and interfering with the sealing ability of the seal. If side-specific templates are used, then the drop-holes may be sized to a larger diameter, which may improve gas flow characteristics.

The templates discussed herein, in addition to providing locational positioning with a high degree of precision with respect to lower-tolerance features of a ceramic substrate, may also be used to provide additional functionality.

Figure 12:
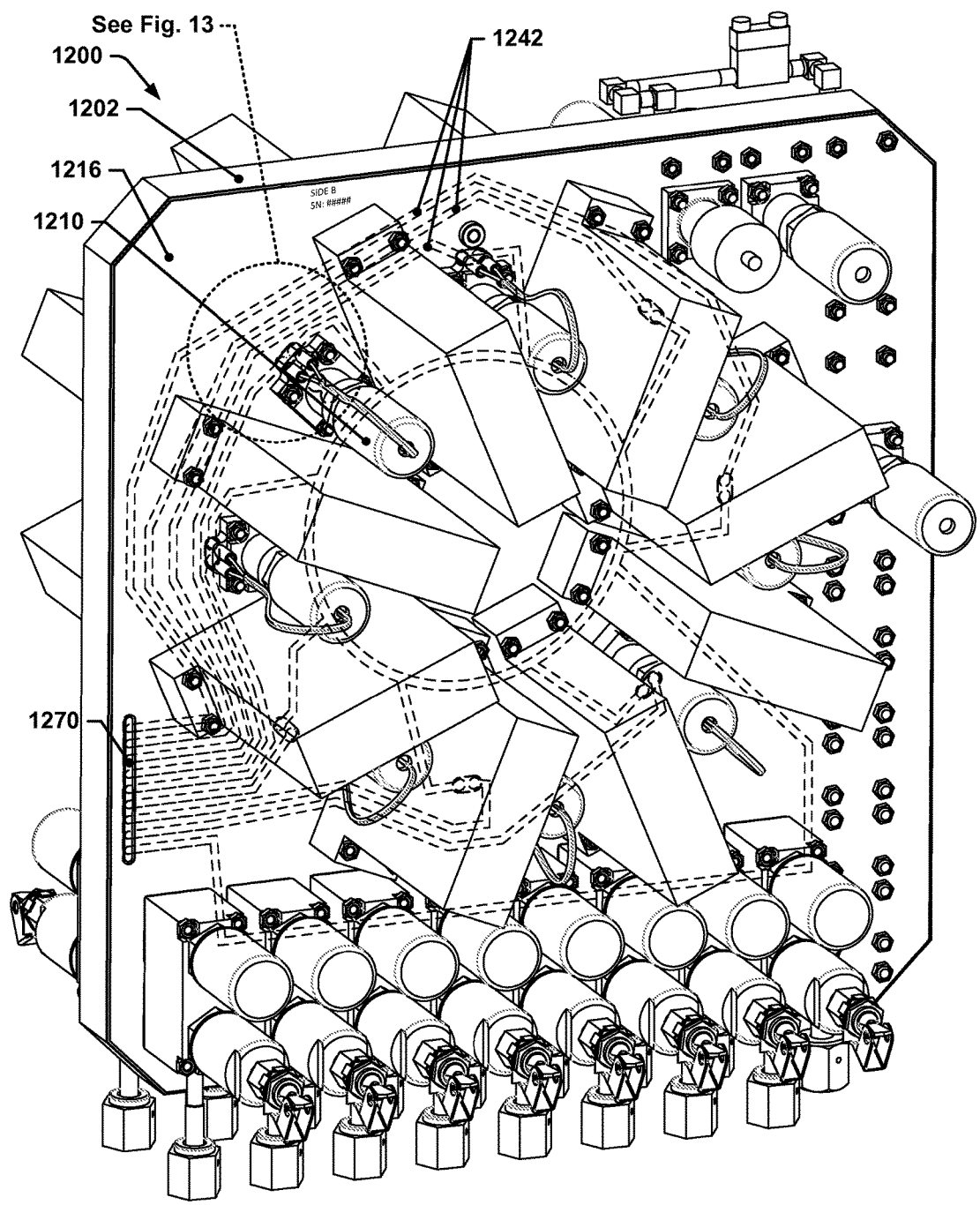
FIG. 12 depicts a CMM that features a template with an electrical interconnect layer that may allow for power or data signals to be sent to or received from various components of the CMM.
Figure 13:
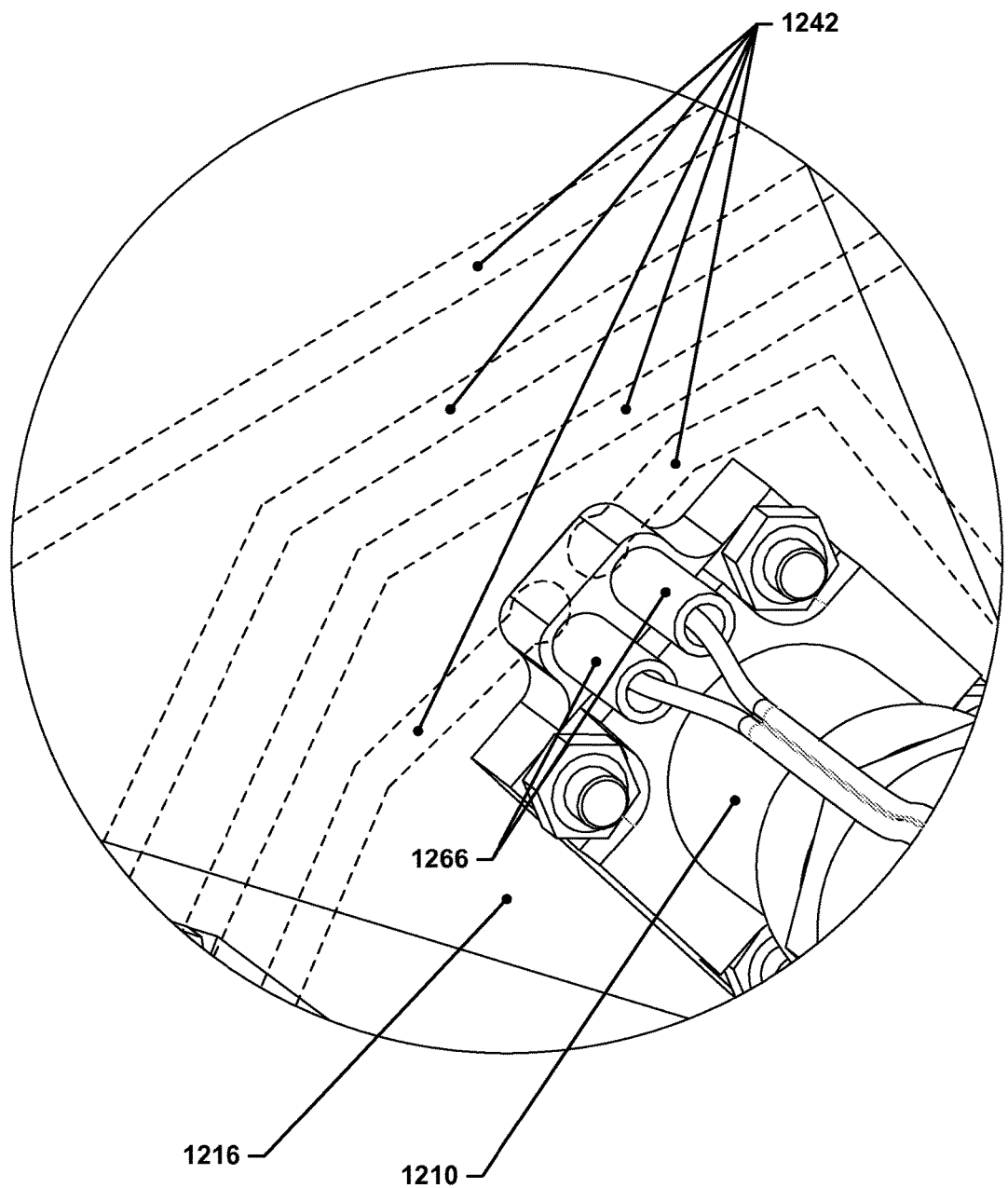
FIG. 13 is a detail view of a portion of the CMM of FIG. 12.

FIG. 12 depicts a CMM that features a template with an electrical interconnect layer that may allow for power or data signals to be sent to or received from various components of the CMM. FIG. 13 is a detail view of a portion of the CMM of FIG. 12. In FIG. 12, a CMM 1200 is depicted that is very similar to the CMM 100 of FIG. 1. Components in FIGS. 12 and 13 that are the same or similar to those in FIG. 1 share the last two numbers of their callouts in common with those of FIG. 1; detailed discussion of these components may not be repeated here in the interest of conciseness. In such cases, the earlier discussion of those components with respect to FIG. 1 may be referred to for further detail regarding the corresponding components in FIG. 12.

The CMM 1200 has a second template 1216 that includes a plurality of conductive pathways 1242 that are routed to different fluid flow components, in this case, valves 1210. The valves 1210, in this example, have built-in spring-loaded electrical contacts 1266 (see FIG. 13) that may protrude through electrical feedthrough features (not visible in FIGS. 12 and 13) and contact the conductive pathways 1242. In this manner, electrical power to operate the valves 1210 may be provided by the conductive pathways 1242 within the second template 1216. The first template (not shown) may have similar features, if desired. The conductive pathways 1242 may be routed, as necessary, so as to avoid various holes through the second template 1216, and may terminate at one or more common locations to allow a connector to be attached. In the present example, all nine conductive pathways (8 power signal pathways, one for each valve 1210 in the circular array of valves 1210 shown, and one common ground path) terminate at an electrical feedthrough 1270 shown at the far left side of the CMM 1200. A connector with spring-loaded contacts may be connected at this electrical feedthrough 1270 in order to supply power/actuation signals to various valves 1210 that interface with the conductive pathways 1242.

Figure 14:
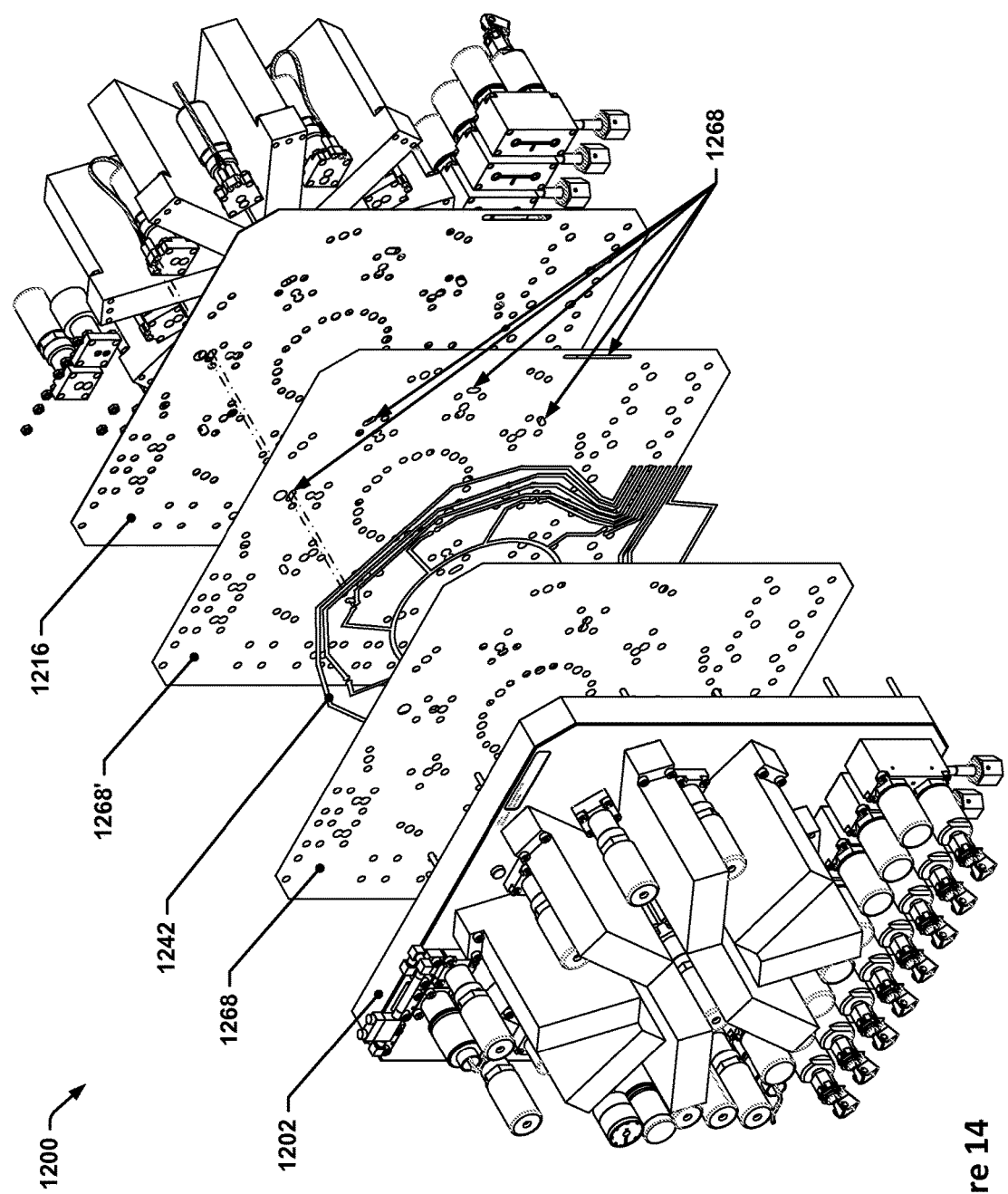
FIG. 14 depicts an exploded view of the CMM of FIG. 12.

FIG. 14 depicts an exploded view of the CMM of FIG. 12. As can be seen, the conductive pathways 1242 may be sandwiched between two insulating layers 1268 and 1268', which may, for example, be made from Kapton or other insulating material, that electrically isolate the conductive pathways 1242 from the second template 1216 and the ceramic substrate 1202. In some instances, one or both of these insulating layers may be omitted if the conductive pathways 1242 are pressed against non-conductive surfaces of the CMM 1200 when the CMM 1200 is assembled. For example, if the second template is made from an electrically non-conductive material, e.g., plastic, then a separate insulator layer may not be needed between the conductive pathways 1242 and the second template 1216.

As can be seen, the insulating layers 1268 and 1268' are largely identical—the only differences, in this case, are that the insulating layer 1268' includes electrical feedthroughs 1270 at locations where electrical communication through the second template 1216 and the insulating layer 1268' to the conductive pathways 1242 is needed. The various insulating layers 1268 and 1268' and conductive pathways 1242 may be assembled with the second template 1216 and glued or otherwise assembled together to form a single assembly. It is also to be understood that multiple layers of conductive pathways 1242 and intervening insulating layers 1268 may be included in such an assembly if complex, multi-layer electrical routing is required.

By incorporating conductive pathways 1242 into the first and/or second template, the CMM may provide a tightly-integrated gas management solution that reduces the number of cable connections that must be made, as well as the number of cables that must be manufactured and managed within the assembly.

Figure 15:
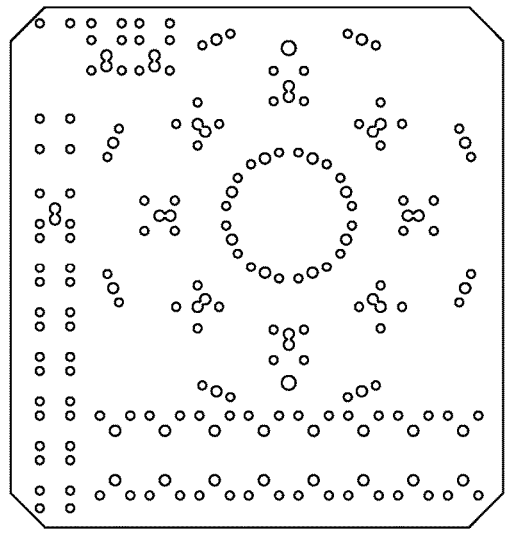
FIG. 15 depicts a template layer.
Figure 16:
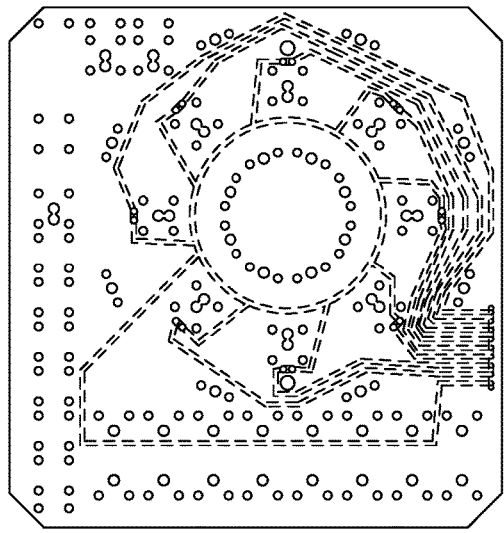
FIG. 16 depicts an electrical interconnect layer that may provide electrical interconnects between components affixed to a ceramic substrate using the template of FIG. 15.
Figure 17:
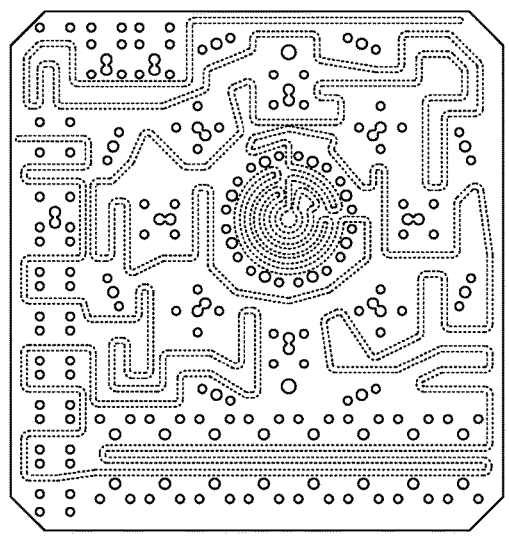
FIG. 17 depicts a temperature control layer with a resistive heater element that meanders across the layer.
Figure 18:
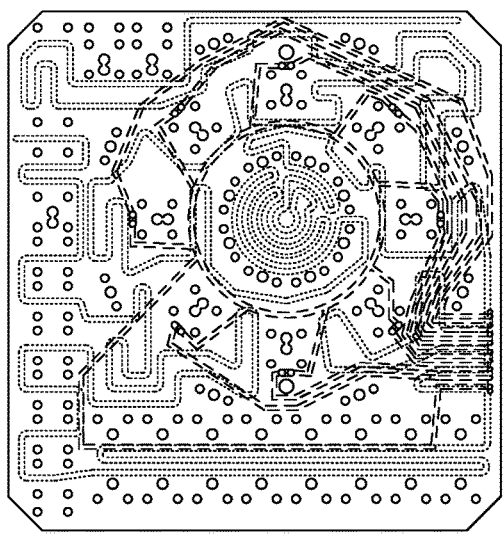
FIG. 18 depicts the layers of FIGS. 15 through 17 stacked in a layered arrangement.

In addition to providing an electrical interconnect layer (or layers), the templates discussed above may also (or alternatively) provide temperature-control functionality. For example, resistive heater elements may be included in a layer that is bonded to, or otherwise assembled with, the templates. FIGS. 15 through 17 depict various example layers of a template, with FIG. 18 depicting a stack-up of the layers shown in FIGS. 15 through 17.

FIG. 15 depicts a template layer, which may be formed, as discussed above, by machining or otherwise modifying a template blank. The template layer may provide functionality relating to providing precision mounting of various fluid flow components. FIG. 16 depicts an electrical interconnect layer (dashed lines) that may provide electrical interconnects between components affixed to the ceramic substrate using the template of FIG. 15. FIG. 17 depicts a temperature control layer with a resistive heater element (dotted lines) that meanders across the layer (current may be routed through the resistive heater element from one end of the element, e.g., the end in the upper right, to the other, e.g., the end near the upper left, in order to produce heat). The resistive heater element may be isolated, in a manner similar to the electrical interconnect layer, between two insulating layers. In some cases, if a resistive heater layer and an electrical interconnect layer are adjacent to one another, they may share a common insulating layer between them. The resistive heater element may be supplied with electrical power through electrical feedthroughs (not shown) similar to those used for the electrical interconnect layer, or by some other mechanism. In both cases where electrical power is supplied to a layer of the template, an alternative to the electrical feed-through approach may be to simply extend the insulating layers and conductive pathways or heater elements beyond the edge of the template to form a ribbon cable or other flexible conductor that may be interfaced with a connector or connection terminal or some sort.

In addition to the electrically-based enhancements that templates may provide to a CMM, templates may also provide a convenient mechanism for providing structural support for the CMM, as well as for other modules that may be connected with the CMM.

Figure 19:
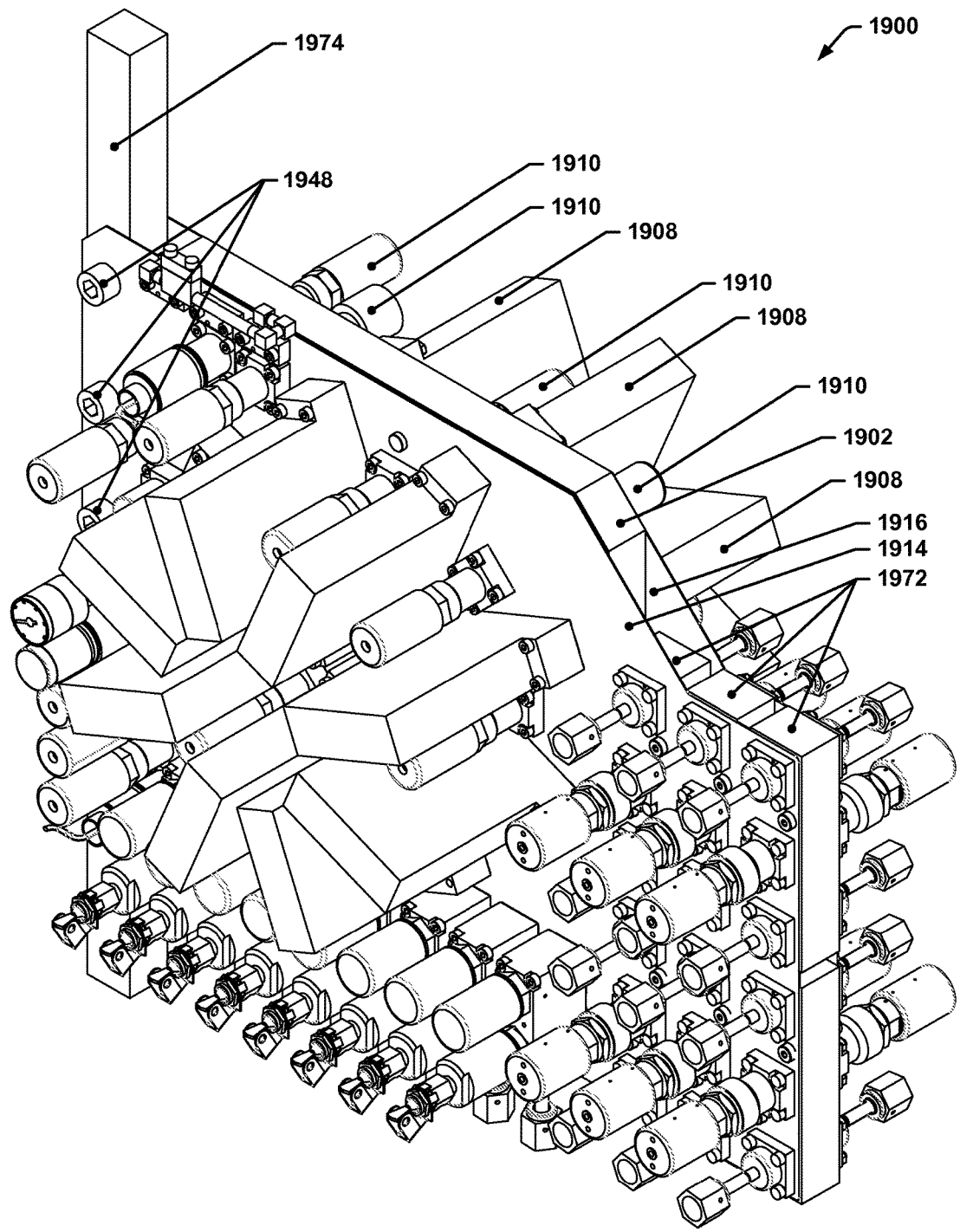
FIG. 19 depicts an isometric view of a CMM with expanded templates providing structural support for the CMM and for daughtboard modules.
Figure 20:
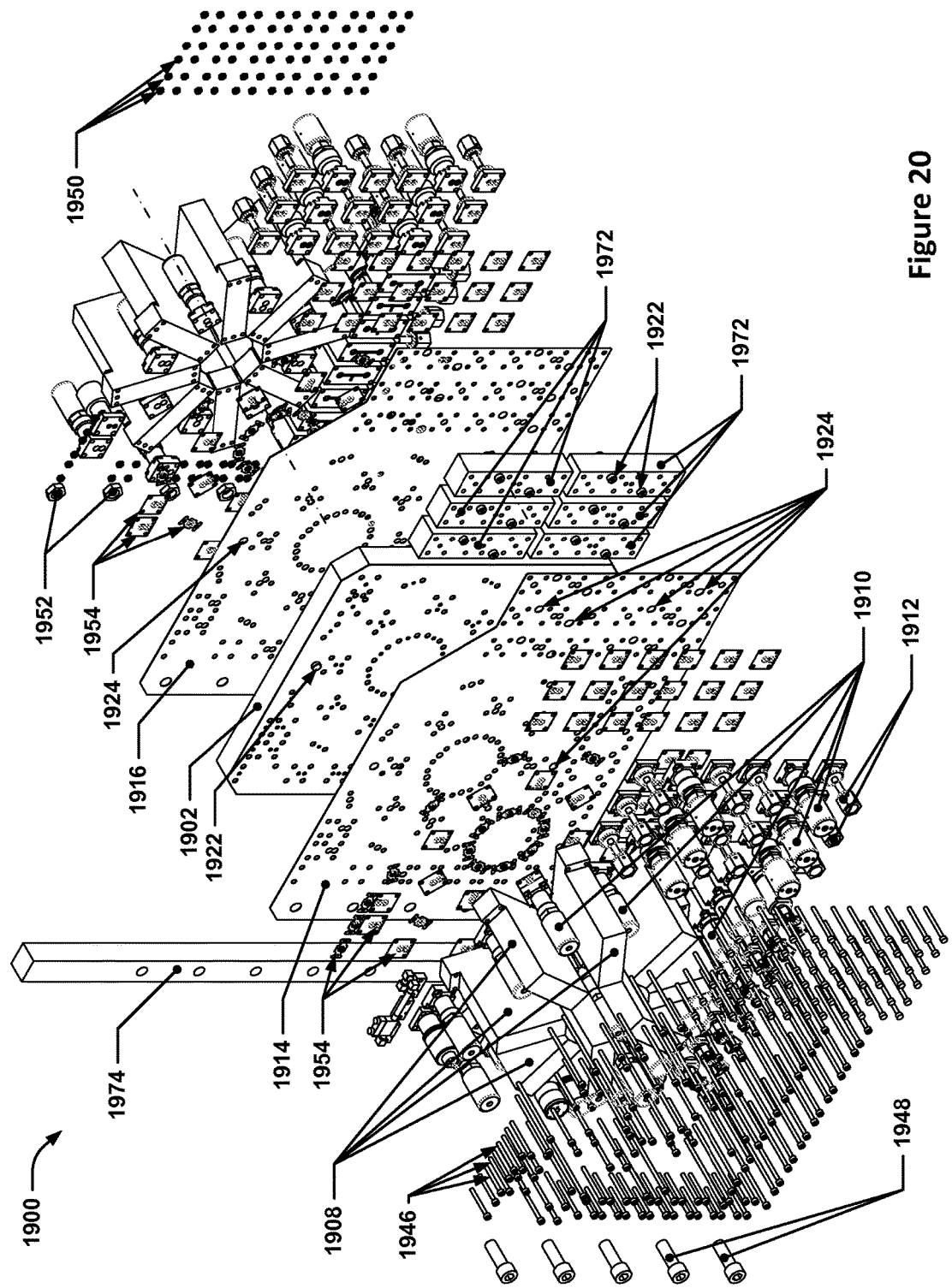
FIG. 20 depicts an exploded view of the CMM of FIG. 19.

FIG. 19 depicts an isometric view of a CMM with expanded templates providing structural support for the CMM and for daughtboard modules. FIG. 20 depicts an exploded view of the CMM of FIG. 19. In FIGS. 19 and 20, a CMM 1900 is depicted that is very similar to the CMM 100 of FIG. 1. Components in FIG. 19 that are the same or similar to those in FIG. 1 share the last two numbers of their callouts in common with those of FIG. 1; detailed discussion of these components may not be repeated here in the interest of conciseness. In such cases, the earlier discussion of those components with respect to FIG. 1 may be referred to for further detail regarding the corresponding components in FIG. 19.

In FIG. 19, the first template 1914 and the second template 1916 are larger in area than the ceramic substrate 1902. On the left side of FIG. 19, the first template 1914 and the second template 1916 overhang the edge of the ceramic substrate and overlap with a support structure 1974, which may be a portion of the structural frame of a semiconductor processing tool. Mounting bolts 1948 may, in conjunction with mounting bolt nuts 1952, pin the support structure 1974, the first template 1914, and the second template 1916 together.

The first template 1914 and the second template 1916 may also include other overhangs, such as the overhangs on the right side of FIG. 19. As can be seen, a number of "daughterboard" modules 1972 (six total, in this example) are connected with the ceramic substrate 1902 by the first template 1914 and the second template 1916 in this example. These daughterboard modules 1972 may be made from ceramic as well, or may be made from other materials, such as stainless steel. The daughterboard modules may be used to expand the functionality provided by the CMM 1900, e.g., for gas tuning purposes, by providing for additional valving or other fluid control options.

The templates discussed herein may also incorporate marking functionality. For example, a particular template may be marked with outlines of the mounting footprints of various fluid flow components that are to be connected to the CMM, as well as with labels indicating the model number of the components that are to be affixed in each such designated location. This may ensure that the proper components are placed in the proper locations.

In some implementations, there may be features on a ceramic substrate for which corresponding features in a template are deliberately not included. For example, a ceramic substrate may be designed to be used with a wide variety of different semiconductor manufacturing processes. In some of these processes, chemicals may be used that are incompatible with particular types of fluid flow components. Fluid flow components that have reduced chemical compatibility, or that may present a danger when used with a particular type of chemical, may include a "poka-yoke" feature, which is a protuberance on face of the component that is used to mount the component to a fluid flow system. If the surface to which the component is to be mounted does not have a corresponding receptacle, then the poka-yoke feature prevents the component from being mounted.

In a CMM context, some or all of the fluid flow component locations on the ceramic substrate may include poka-yoke receptacles, thus allowing components with poka-yoke features and without poka-yoke features to be used in such locations. Thus, only one ceramic substrate design may need to be maintained or produced for any of a variety of different semiconductor processes, thus reducing the manufacturing costs of the ceramic substrate. The templates made for such processes may, however, either include or not include passthroughs for the various poka-yoke features, as needed, depending on a particular component layout for a given CMM design.

Figure 21:
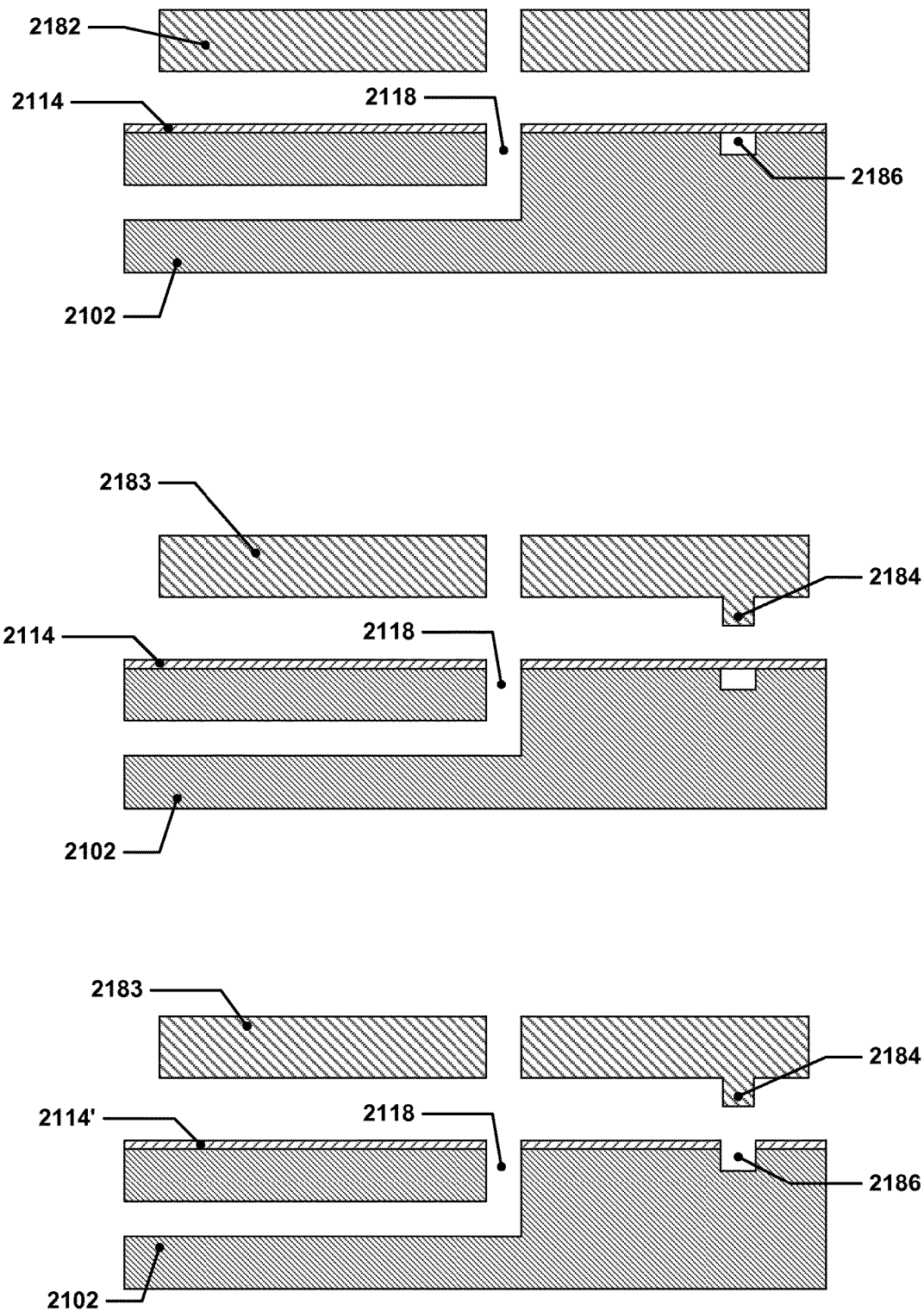
FIG. 21 depicts three cross-sections of a ceramic substrate and two different fluid flow components.

FIG. 21 depicts three cross-sections of a ceramic substrate and two different fluid flow components. In the upper cross-section, a fluid flow component 2182 (only the base of the fluid flow component 2182 is shown) that does not have a poka-yoke feature is shown. The fluid flow component 2182 may be located with respect to a ceramic substrate 2102 by a first template 2114 with a first drop-hole 2118 (the seals and component-locating features of the first template 2114 are not shown here). The ceramic substrate 2102 also has a poka-yoke receptacle 2186 that is, in this example, covered up by the first template 2114.

In the middle cross-section, the fluid flow component 2182 visible in the upper cross-section has been replaced by a fluid flow component 2183, which includes a poka-yoke feature 2184. The first template 2114 will prevent the poka-yoke feature 2184 from interfacing with the poka-yoke receptacle 2186, and thus will prevent the fluid flow component 2183 from being mounted to the ceramic substrate 2102.

The bottom cross-section shows the same components as the middle cross-section, but the first template 2114 has been replaced with a different first template 2114'. The new first template 2114' is equipped with a poka-yoke feed-through hole in the location of the poka-yoke receptacle 2186. This allows the fluid flow component 2183 to be mounted to the ceramic substrate 2102.

It is to be understood, as a general matter, that while reference is made herein to various coordinate systems, such coordinate systems may be defined as desired—it will be appreciate that the ultimate result is that the various feature locations on a ceramic substrate may be transferred to a separate template by measuring the relative locations (or average locations, in some cases) of those features on the ceramic substrate and then transferring that pattern of features to the templates discussed herein. In this manner, the precise alignment of various fluid flow components relative to the ceramic substrate may be assured to be within a desired degree of tolerancing that may not be achievable in a sintered ceramic part without extensive post-sintering machining.

It is also to be understood that a library of data files may be maintained for various ceramic substrates and templates that may be made according the techniques outlined herein. For example, each ceramic substrate that is manufactured may be marked with a serial number that is then associated with the measured locations of each feature on the ceramic substrate and/or a template design based on such measured locations (alternatively or additionally, each template may be marked with a serial number specific to that template design). Thus, if a replacement template is ever required, the appropriate template design file (or "cut-file") may be loaded from memory into a computer-controlled mill, laser cutter, or other sheet-metal cutting device based on the ceramic substrate serial number (or template serial number) and then used to re-create the needed template.

Thus, for example, once a template has been manufactured and provided to a customer as part of a CMM or a semiconductor processing tool incorporating a CMM and the design file for the template has been saved into a non-volatile memory, the customer may, at a later date, request a replacement for one of the templates, e.g., if a template is bent or otherwise harmed during maintenance processes. The manufacturer of the templates, upon receiving such a request, may retrieve the corresponding template design file from the memory and then form a replacement template, with replacement template-locating features, replacement component-locating features, etc., and then provide the replacement template to the customer.

The templates described herein may, as discussed above, be made from a variety of different materials, including, but not limited to, stainless steel alloy, aluminum alloy, plastic, fiberglass, printed circuit board substrate material, and ceramic. In implementations where electrical isolation is desired for components adjacent to the templates, e.g., electrical traces or a resistive heater element, such components may be separated from the templates by a layer of electrical insulation, as discussed earlier in this paper. In implementations where the template itself is made of a non-conductive material, then an additional insulating layer may be optional. In some such implementations, the components requiring electrical isolation, e.g., circuit traces, may be contained within the template, e.g., the template may be a printed circuit substrate with electrically conductive traces embedded within it.

The equipment described herein may be connected with various other pieces of equipment, e.g., a semiconductor process chamber, in a semiconductor processing tool. Typically, a CMM such as that described herein may be connected with a controller that may control the fluid control components attached to the CMM, as well as any temperature control layers that may be part of the CMM. Such a controller may include one or more processors and a memory that stores instructions for controlling the CMM, including, if present, the heating elements to provide desired amounts of various process gases at various times for a given semiconductor process. The controller may typically include one or more memory devices and one or more processors configured to execute the instructions such that the apparatus will operate the valves and/or MFCs so as to provide the needed process gases at the desired times. Machine-readable media containing instructions for controlling process operations in accordance with the present disclosure may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is also to be understood that the techniques discussed herein for the production of templates, e.g., by measuring the locations of features on a post-sintered ceramic substrate and then manufacturing a template with features positioned at corresponding locations on the template, may be practiced using a computer-controlled system. In such a system, a memory may stores computer-executable instructions for controlling one or more processors to perform one or more of the various operations discussed above with respect to the manufacture of a template or templates.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An apparatus comprising:
    a ceramic monolithic manifold (CMM) for routing semiconductor processing gases between various fluid flow components, the CMM including:
        a plurality of internal passages,
        a plurality of first drop-holes formed in a first side of the CMM prior to sintering the CMM, each first drop-hole leading to one of the internal passages, and
        one or more reference features formed after the CMM has been sintered; and
    a first template, the first template including:
        one or more first template-locating features configured to interface with the one or more reference features of the CMM so as to locate the first template relative to the CMM when the first template is laid against the first side of the CMM, and
        one or more first component-locating features that are positioned with respect to a template reference coordinate system defined by the one or more first template-locating features based, at least in part, on measured positions of the first drop-holes relative to a substrate reference coordinate system defined by the one or more reference features, wherein:
            the first template is laid against the first side of the CMM and the one or more first template-locating features is interfaced with the one or more reference features,
            each first component-locating feature is positioned over one of the first drop-holes, and
            each first component-locating feature is configured to position one of a plurality of first fluid flow components relative to one or more of the first drop-holes when that first fluid flow component is mounted to the apparatus.

2. The apparatus of claim 1, wherein the first template is formed from a sheet of material.

3. The apparatus of claim 2, wherein the material of the sheet of material is selected from the group consisting of:

stainless steel alloy, aluminum alloy, plastic, fiberglass, printed circuit board substrate material, and ceramic.

4. The apparatus of claim 1, wherein the first template further includes a resistive heater layer.

5. The apparatus of claim 1, wherein the first template further includes an electrical interconnect layer including a plurality of conductive pathways that are electrically isolated from one another within the electrical interconnect layer and that are configured to communicate electrical signals to one or more of the first fluid flow components when the first fluid flow components are mounted to the CMM and the first template is interposed between the one or more of the one or more first fluid flow components and the CMM.

6. The apparatus of claim 1, wherein the first template further includes one or more textual or graphical indicators indicating mounting locations for one or more of the first fluid-flow components.

7. The apparatus of claim 1, wherein the CMM also includes poka-yoke receptacles in one or more locations on the first side and the first template does not have openings in at least some locations with respect to the template reference coordinate system that correspond to the locations of the poka-yoke receptacles with respect to the substrate reference coordinate system.

8. The apparatus of claim 1, wherein:
the CMM further includes one or more sets of first component-mounting features,
each first component-mounting feature is associated with one of the first component-locating features,
the first template further includes one or more sets of first component-mounting feature pass-throughs,
each first component-mounting feature pass-through is associated with a different one of the first component-locating features, and
each first component-mounting feature pass-through is positioned such that that first component-mounting feature pass-through is collocated with the associated first component-locating feature when the template is laid against the CMM with the one or more first template-locating features interfaced with the one or more reference features.

9. The apparatus of claim 8, wherein the CMM further includes a plurality of second drop-holes in a second side of the CMM opposite the first side of the CMM, the apparatus further comprising:
a second template, the second template including:
one or more second template-locating features configured to interface with the one or more reference features of the CMM so as to locate the second template relative to the CMM, and
one or more second component-locating features that are positioned with respect to a second template reference coordinate system defined by the one or more second template-locating features based, at least in part, on measured positions of the second drop-holes relative to the substrate reference coordinate system, wherein:
each second component-locating feature is configured to position a second fluid flow component relative to one or more of the second drop-holes when that second fluid flow component is mounted to the apparatus.

10. The apparatus of claim 9, wherein:
the first template and the second template match with respect to the positions of the first and second template-locating features and the first and second component-locating features, respectively.

11. A method comprising:
forming a plurality of first drop-holes in a first side of a ceramic substrate;
sintering the ceramic substrate after forming the plurality of first drop-holes in the first side of the ceramic substrate;
forming one or more reference features in the ceramic substrate after the ceramic substrate has been sintered;
measuring a two-dimensional location of each first drop-hole relative to a substrate reference coordinate system defined by the one or more reference features;
forming one or more template-locating features in a template, the one or more template-locating features configured to interface with the one or more reference features so as to allow the template to be laid against the ceramic substrate and fixed in at least two dimensions relative to the ceramic substrate by interfacing the one or more template-locating features with the one or more reference features; and
forming one or more component-locating features in the template, each component-locating feature positioned relative to a template reference coordinate system defined by the one or more template-locating features based, at least in part, on the measured location of one of the first drop-holes relative to the substrate reference coordinate system.

12. The method of claim 11, further comprising:
storing the location of each component-locating feature relative to the template reference coordinate system in a non-volatile, computer-readable medium;
receiving a request for a replacement template;
retrieving, responsive to the request for a replacement template, the location of each component-locating feature relative to the template reference coordinate system from the non-volatile, computer-readable medium;
forming one or more replacement template-locating features in a replacement template, the one or more replacement template-locating features configured to interface with the one or more reference features so as to allow the replacement template to be placed on the ceramic substrate and fixed in at least two dimensions relative to the ceramic substrate, and
forming one or more replacement component-locating features in the replacement template, each replacement component-locating feature positioned relative to a replacement template reference coordinate system defined by the one or more replacement template-locating features at locations corresponding to the locations of the component-locating features relative to the template reference coordinate system retrieved from the non-volatile, computer-readable medium.

13. The method of claim 11, further comprising:
forming, prior to sintering the ceramic substrate, a plurality of second drop-holes in a second side of the ceramic substrate opposite the first side of the ceramic substrate, wherein there are at least some first drop-hole and second drop-hole pairs in which the second drop-hole in the pair is positioned in a location that corresponds with the location of the first drop-hole in the pair prior to the sintering;
measuring the position of each second drop-hole relative to the one or more reference features; and
determining, for each first and second drop-hole pair, an average location for the first drop-hole and the second drop-hole in the pair by interpolating between the location of the first drop-hole in the pair relative to the substrate reference coordinate system and the location of the second drop-hole in the pair relative to the substrate reference coordinate system, wherein forming the one or more component-locating features in the template includes forming at least some component-locating features at locations relative to the template reference coordinate system that correspond with corresponding average locations for the first drop-hole and second drop-hole pairs.

* * * * *